United States Patent
Kameda et al.

(10) Patent No.: US 8,513,970 B2
(45) Date of Patent: Aug. 20, 2013

(54) SEMICONDUCTOR DEVICE AND METHOD OF TESTING THE SAME

(75) Inventors: Yoshio Kameda, Tokyo (JP); Yoshihiro Nakagawa, Tokyo (JP); Koichiro Noguchi, Tokyo (JP); Masayuki Mizuno, Tokyo (JP); Koichi Nose, Tokyo (JP)

(73) Assignee: NEC Corporation, Tokyo (JP)

( * ) Notice: Subject to any disclaimer, the term of this patent is extended or adjusted under 35 U.S.C. 154(b) by 235 days.

(21) Appl. No.: 13/139,609

(22) PCT Filed: Dec. 22, 2009

(86) PCT No.: PCT/JP2009/007125
§ 371 (c)(1),
(2), (4) Date: Jun. 14, 2011

(87) PCT Pub. No.: WO2010/073624
PCT Pub. Date: Jul. 1, 2010

(65) Prior Publication Data
US 2011/0260747 A1    Oct. 27, 2011

(30) Foreign Application Priority Data
Dec. 26, 2008    (JP) .................................. 2008-333117

(51) Int. Cl.
*G01R 31/02*    (2006.01)
(52) U.S. Cl.
USPC ................. 324/762.01; 324/762.02; 324/500; 257/499
(58) Field of Classification Search
None
See application file for complete search history.

(56) References Cited

U.S. PATENT DOCUMENTS 7,242,080 B2 *    7/2007    Matsuno .................... 257/679

FOREIGN PATENT DOCUMENTS

| JP | 2-117147 A | 5/1990 |
|----|------------|--------|
| JP | 2-172268 A | 7/1990 |
| JP | 3-34555 A | 2/1991 |
| JP | 6-125063 A | 5/1994 |
| JP | 8-148533 A | 6/1996 |
| JP | 11-354721 A | 12/1999 |
| JP | 2000124279 A | 4/2000 |
| JP | 2000150429 A | 5/2000 |
| JP | 2004165611 A | 6/2004 |
| JP | 2005134405 A | 5/2005 |
| JP | 2005150514 A | 6/2005 |
| JP | 2006310495 A | 11/2006 |
| JP | 2006351633 A | 12/2006 |

OTHER PUBLICATIONS

International Search Report for PCT/JP2009/007125 mailed Feb. 9, 2010.

* cited by examiner

*Primary Examiner* — Melissa Koval
*Assistant Examiner* — Trung Nguyen

(57) ABSTRACT

A semiconductor device (1) includes a semiconductor wafer (11) on which a plurality of semiconductor chip forming regions (1A) is formed, a circuit section (12) which is provided within each of the semiconductor chip forming regions (1A) of the semiconductor wafer (11), a control circuit section (14), provided within each of the semiconductor chip forming regions (1A) and connected to the circuit section (12), that controls electric power supplied to the circuit section (12), a power supply line (18) connected to the plurality of control circuit section (14), and a reference power line (17) connected to the plurality of control circuit section (14). In each of the control circuit sections (14), a voltage of electric power supplied from the power supply line (18) is controlled on the basis of a reference voltage from the reference power line (17).

18 Claims, 18 Drawing Sheets

SEMICONDUCTOR DEVICE AND METHOD OF TESTING THE SAME

TECHNICAL FIELD

The present invention relates to a semiconductor device and a method of testing the same.

BACKGROUND ART

A semiconductor device manufacturing process is divided into a pre-process of forming a plurality of semiconductor circuits on a semiconductor substrate and a post-process of forming semiconductor chips by individually cutting the semiconductor substrate in which a plurality of circuits is formed. In either of the processes, a test for determining the quality of the manufactured semiconductor chip is performed, and the processes are called a pre-process test and a post-process test, respectively. In a test, signals are transmitted and received between a tester and a semiconductor circuit.

In the pre-process test, when semiconductor circuits are tested in the state of the semiconductor substrate, a method of transmitting and receiving signals is broadly divided into a contact method and a noncontact method.

The contact method is a method in which a probe needle is placed against a pad connected to the semiconductor circuit, and the tester and the semiconductor circuit are connected to each other through the probe needle. On the other hand, the noncontact method is a method in which signals are transmitted and received to and from the semiconductor circuit by magnetic coupling or capacitive coupling and the like, and a test is performed through a magnetic coupling probe or a capacitive coupling probe moved closer to the semiconductor circuit. The noncontact method in which a probe needle is not used has an effect of lowering test costs because the probe is not abraded.

In addition, a method of testing a semiconductor circuit includes a function test and a static power source current test.

The function test is a method in which test vectors are input to the semiconductor circuit and an output thereof is compared with an expected value which is previously calculated, to thereby determine the quality of the semiconductor circuit. On the other hand, the static power source current test is a method in which attention is drawn to the fact that a defective semiconductor circuit retains a high static power source current level, and the power source current in the resting state having no fluctuation in the input value is measured and compared with the normal quiescent power source current, to thereby determine the quality of the semiconductor circuit. When the operation of the semiconductor circuit is ensured with a certain width of the power source voltage, the function test and the static power source current test are performed by changing the voltage in the width of the power source voltage. Since the change of the power source voltage or the measurement of the power source current is possible, a high-accuracy test can be performed.

Here, simultaneous testing of a plurality of semiconductor circuit is effective as a method of lowering test costs.

Particularly, as a method of efficiently performing the pre-process test in the state of the semiconductor substrate, Patent Document 1 proposes a method of sharing the power line in a plurality of semiconductor chips. According to this method, it is possible to simultaneously apply the voltage to a plurality of semiconductor chips sharing the power line by placing a needle against a pad of one spot connected to the power line and applying a necessary voltage from the test device.

In addition, Patent Documents 2 and 3 also disclose a structure in which a power source is supplied from one power interconnect to a plurality of semiconductor circuits.

Further, when an overcurrent flows due to a certain defective semiconductor chip, in order to avoid a problem that the test of all semiconductor chips sharing the power line cannot be performed, Patent Document 4 proposes a method in which a fuse is provided in an interconnect between a probing pad leading to the power line connected to a plurality of semiconductor chips and a bonding pad, and the fuse is melted down due to the overcurrent, to thereby electrically decouple a defective semiconductor chip from the common power line.

In addition, as a method of simultaneously performing a quiescent power source current test on a plurality of chips, Patent Document 5 proposes a test method in which a function of cutting off a power source voltage as necessary is given by providing a power source voltage generator and a detector that detecting fluctuation of the power source voltage with the semiconductor chip.

Further, there are Patent Documents 6 to 8 as the background art.

[Patent Document 1] Japanese Unexamined Patent Publication No. H03-34555
[Patent Document 2] Japanese Unexamined Patent Publication No. H06-125063
[Patent Document 3] Japanese Unexamined Patent Publication No. H11-354721
[Patent Document 4] Japanese Unexamined Patent Publication No. 2000-124279
[Patent Document 5] Japanese Unexamined Patent Publication No. 2005-134405
[Patent Document 6] Japanese Unexamined Patent Publication No. 2000-150429
[Patent Document 7] Japanese Unexamined Patent Publication No. 2005-150514
[Patent Document 8] Japanese Unexamined Patent Publication No. H08-148533

DISCLOSURE OF THE INVENTION

However, in the method of sharing the power line on the semiconductor substrate in a plurality of semiconductor chips, there is the following problem.

There may be a case where the power line becomes longer with an increase in the diameter in the semiconductor substrate, and a voltage applied to the semiconductor circuit as distant from the power supply point decreases. Therefore, the voltage applied to the semiconductor circuit becomes non-uniform depending on the distance from the voltage supply point. The test has to be performed at a predetermined power source voltage, but in a circuit to which a predetermined power source voltage is not applied, deterioration of the accuracy of the test is caused in that a thing which is originally discriminated to be defective is determined to be non-defective.

In addition, even when the voltage applied to the semiconductor chip can be made constant on the design without depending on the distance from the power supply point by adjusting the length or thickness of the power line, there is the following problem. The variation in the manufacturing process increases with miniaturization of the semiconductor chip and an increase in the diameter of the semiconductor substrate, and the line width or the interconnect resistance on the semiconductor substrate varies. For this reason, even when the voltage is made constant on the design, there may be a case where inconstancy occurs in the voltage which is actually applied. Deterioration of the accuracy of the test is caused due to the inconstancy of the voltage.

According to the present invention, there is provided a semiconductor device including: a semiconductor wafer in which a plurality of semiconductor chip forming regions is formed; a plurality of circuit sections which is respectively provided within each of the semiconductor chip forming regions of the semiconductor wafer; a plurality of control circuit sections, provided within each of the semiconductor chip forming regions and respectively connected to each of the circuit sections, that controls electric power supplied to the circuit section; a power supply line connected to a plurality of the control circuit sections; and a reference power line connected to a plurality of the control circuit sections, wherein a voltage of electric power supplied from the power supply line is controlled in the control circuit section on the basis of a reference voltage from the reference power line.

In addition, according to the present invention, there is also provided a method of testing the above-mentioned semiconductor device, further including: supplying electric power from the power supply line and the reference power line to the control circuit section, and controlling a voltage of electric power supplied from the power supply line, in the control circuit section, on the basis of a reference voltage from the reference power line, to adjust a voltage of electric power supplied to the circuit section and perform a test of the circuit section.

According to the invention, it is possible to provide a semiconductor device capable of improving accuracy of the test and a test method in which the semiconductor device is used.

BRIEF DESCRIPTION OF THE DRAWINGS

The above-mentioned objects, other objects, characteristics and advantages will be further obvious from the following preferred embodiments and the accompanying drawings.

BEST MODE FOR CARRYING OUT THE INVENTION

Figure 1:
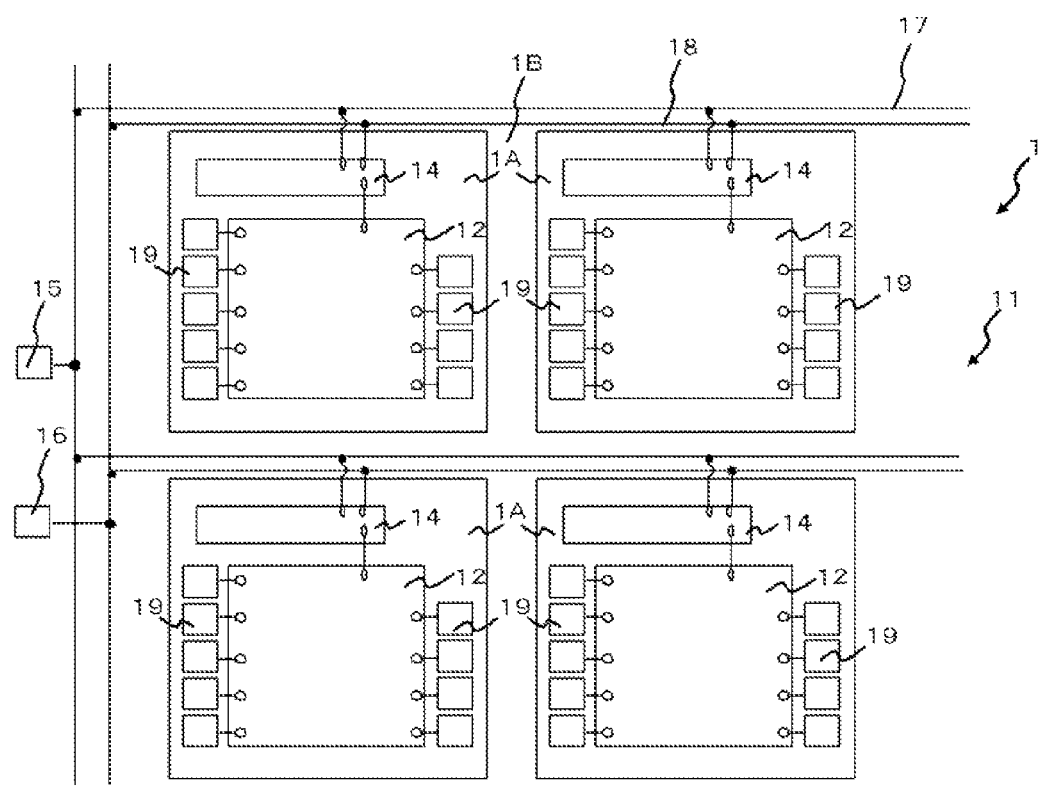
FIG. 1 is a plan view illustrating a semiconductor device according to a first embodiment of the invention.

Hereinafter, the embodiments of the invention will be described with reference to the accompanying drawings. In all the drawings, like elements are referenced by like reference numerals and descriptions thereof will not be repeated.

First Embodiment

First, reference will be made to FIGS. 1 and 2 to describe an outline of a semiconductor device 1 of the embodiment.

The semiconductor device 1 of the embodiment includes a semiconductor wafer 11 on which a plurality of semiconductor chip forming regions 1A is formed, a plurality of circuit sections 12 provided within each of the semiconductor chip forming regions 1A of the semiconductor wafer 11, a plurality of control circuit sections 14, provided within each of the semiconductor chip forming regions 1A and connected to each of the circuit sections 12, that controls electric power supplied to the circuit sections 12, a power supply line 18 connected to the plurality of control circuit sections 14, and a reference power line 17 connected to the plurality of control circuit sections 14.

In each of the control circuit sections 14, voltages of electric power supplied from the power supply line 18 are controlled on the basis of a reference voltage from the reference power line 17.

Next, the semiconductor device 1 will be described in detail.

Figure 2:
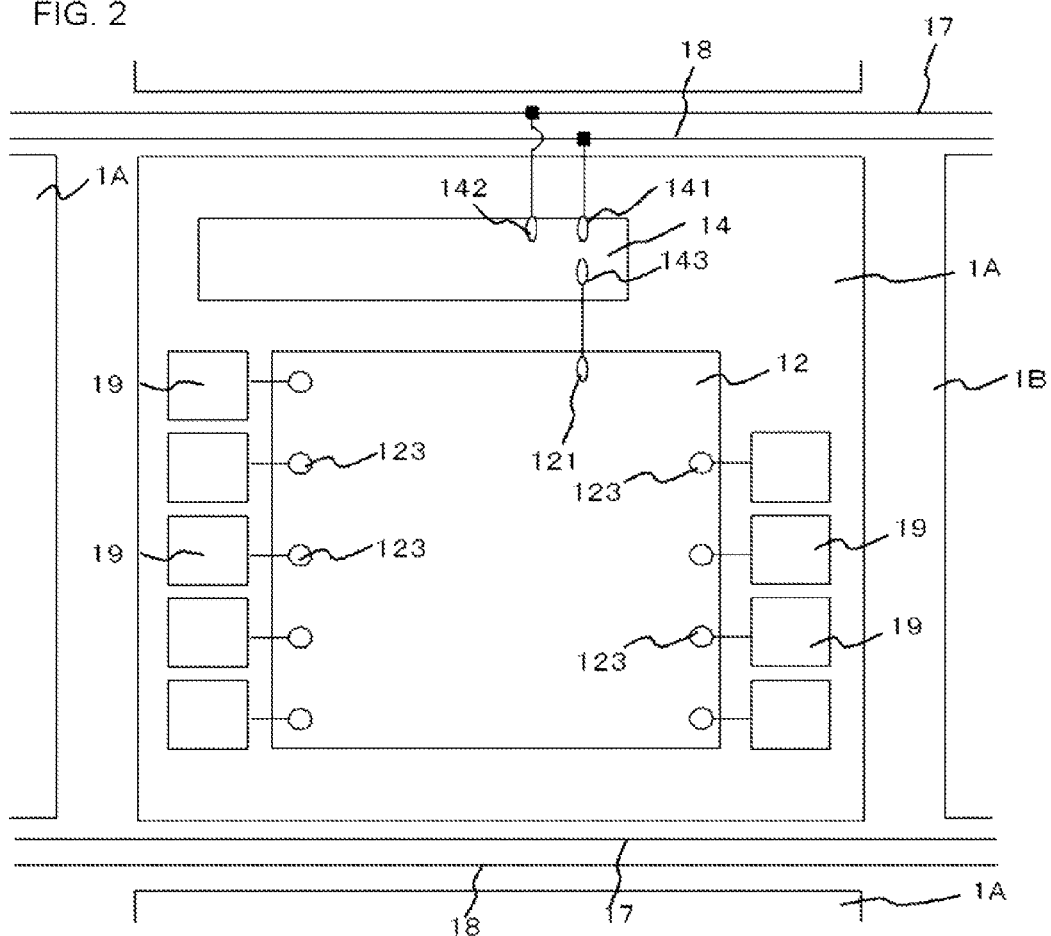
FIG. 2 is an enlarged plan view illustrating a portion of the semiconductor device.

As shown in FIGS. 1 and 2, a plurality of semiconductor chip forming regions 1A and a dicing region 1B disposed between each of the semiconductor chip forming regions 1A are formed on the semiconductor wafer 11 of the semiconductor device 1.

In the dicing region 1B, the power supply line 18 and the reference power line 17 are disposed along the longitudinal direction thereof. The power supply line 18 and the reference power line 17 are respectively connected to a plurality of control circuit sections 14.

In addition, one power supply pad 16 connected to the power supply line 18 is disposed in the dicing region 1B. Further, one reference power pad 15 connected to the reference power line 17 is disposed in the dicing region 1B.

The circuit section 12 and the control circuit section 14 are disposed within each of the semiconductor chip forming regions 1A.

The circuit section 12 is a semiconductor circuit constituting a semiconductor chip, and a plurality of probing/bonding pads 19 is connected to the circuit section 12. The probing/bonding pad 19 is disposed within the semiconductor chip forming region 1A. The probing/bonding pad 19 is a pad which can be used not only in probing but also in bonding.

Meanwhile, the probing/bonding pad may be divided into a probing pad and a bonding pad.

The circuit section 12 can input and output signals through the probing/bonding pads 19, and outputs a result of performing some kind of processing on a provided input signal as a signal. For example, in a contact test method, the circuit section is connected to a test device through a probe needle (terminal) placed against all or a portion of the probing/bonding pads.

In addition, a power supply input portion (power input portion) 121 to which electric power is supplied is formed in the circuit section 12. The power supply input portion 121 is connected to a power supply output portion 143 of the control circuit section 14.

Further, signal input and output portions 123 that perform input and output of signals are formed in the circuit section 12. The signal input and output portion 123 is connected to the probing/bonding pad 19.

Meanwhile, the circuit section 12 is connected to a grounding line which is not shown in the drawing. This grounding line is also connected to another circuit section 12 through the dicing region 1B.

The control circuit section 14 is connected to the circuit section 12, and has a function of controlling the voltage of electric power supplied to the circuit section 12. The power supply line 18 and the reference power line 17 are connected to the control circuit section 14.

Here, although a plurality of control circuit sections 14 is connected to the power supply line 18 and the reference power line 17, all the control circuit sections 14 of the semiconductor device 1 may be connected to the power supply line 18 and the reference power line 17, and some of a plurality of control circuit sections 14 may be connected to the power supply line 18 and the reference power line 17. This allows the amount of the current flowing through one power supply line 18 to be reduced.

A power supply input portion 141 to which the power supply line 18 is connected is formed in the control circuit section 14, and a reference power input portion 142 to which the reference power line 17 is connected is formed therein. A lead-out interconnect connected to the power supply line 18 extends from the power supply input portion 141. Similarly, a lead-out interconnect connected to the reference power line 17 extends from the reference power input portion 142.

Further, the power supply output portion 143 for supplying power to the circuit section 12 is formed in the control circuit section 14.

Figure 3:
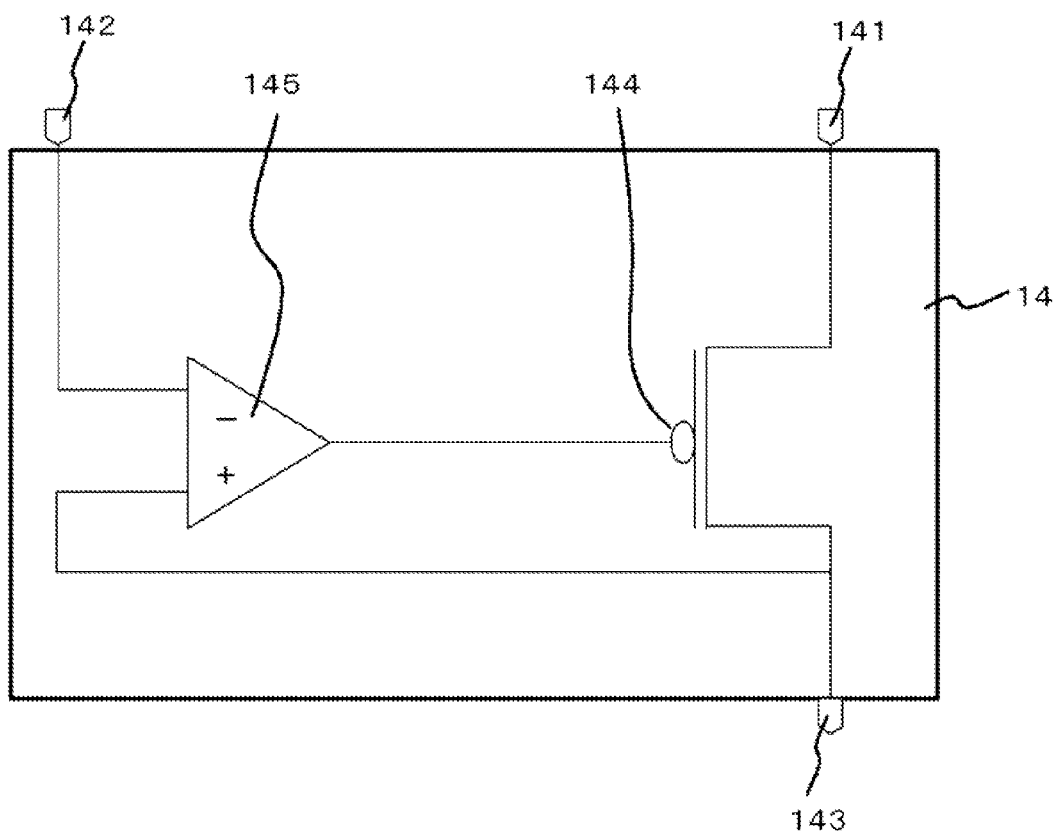
FIG. 3 is a diagram illustrating a control circuit section.

As shown in FIG. 3, the control circuit section 14 includes a P-type transistor (PMOS transistor) 144 and an operational amplifier (arithmetic unit) 145. The reference power input portion 142 and the power supply input portion 141 of the control circuit section 14 are respectively connected to an inverting input terminal of the operational amplifier 145 and a source terminal (source electrode) of the P-type transistor 144.

The power supply output portion 143 of the control circuit section 14 is connected to a drain terminal of the P-type transistor 144 (drain electrode) and a non-inverting input terminal of the operational amplifier 145. An output terminal of the operational amplifier 145 is connected to a gate terminal (gate electrode) of the P-type transistor 199.

The operational amplifier 145 calculates the difference between the voltage provided to the power supply output portion 143 and the voltage provided to the reference power input portion 142. When the calculated difference is equal to or greater than a predetermined value, a resistance value between a source and a drain of the P-type transistor 144 is adjusted by the operational amplifier 145 so that the difference between the voltage applied to the power supply output portion 143 and the reference voltage applied to the reference power input portion 142 is set to be less than a predetermined value. For example, the operational amplifier 195 applies a voltage to the gate terminal of the P-type transistor 144 so as to increase the resistance value between the source terminal and the drain terminal of the P-type transistor 144, and thus a desired voltage is applied to the power supply output portion 143.

When the calculated difference is less than a predetermined value, the operational amplifier 145 does not operate with respect to the P-type transistor 144, and the P-type transistor 144 is driven so that the difference between the voltage provided to the power supply output portion 143 and the voltage provided to the reference power input portion 142 is maintained (the resistance value between the source and the drain of the P-type transistor 144 is adjusted by the operational amplifier 145).

For example, in the control circuit section 14, the voltage of 1.5V is provided to the power supply input portion 141, and the voltage of 1.2 V is provided to the reference power input portion 142, to thereby allow the voltage of 1.2 V to be obtained in the power supply output portion 143.

Meanwhile, the input impedance of the operational amplifier 145 is high. For this reason, even though the voltage drop due to the interconnect resistance of the reference power line 17, or the variation in the line width or the interconnect resistance of the reference power line 17 is generated, the voltage value applied to the reference power input portion 142 is hardly influenced.

That is, the high impedance is applied to the reference power input portion 142. Thereby, even though the voltage value applied to the power supply input portion 141 is lowered, the voltage value applied to the reference power input portion 142 is difficult to lower. The high impedance is applied to the reference power input portion 142 compared to the power supply input portion 141.

Figure 4:
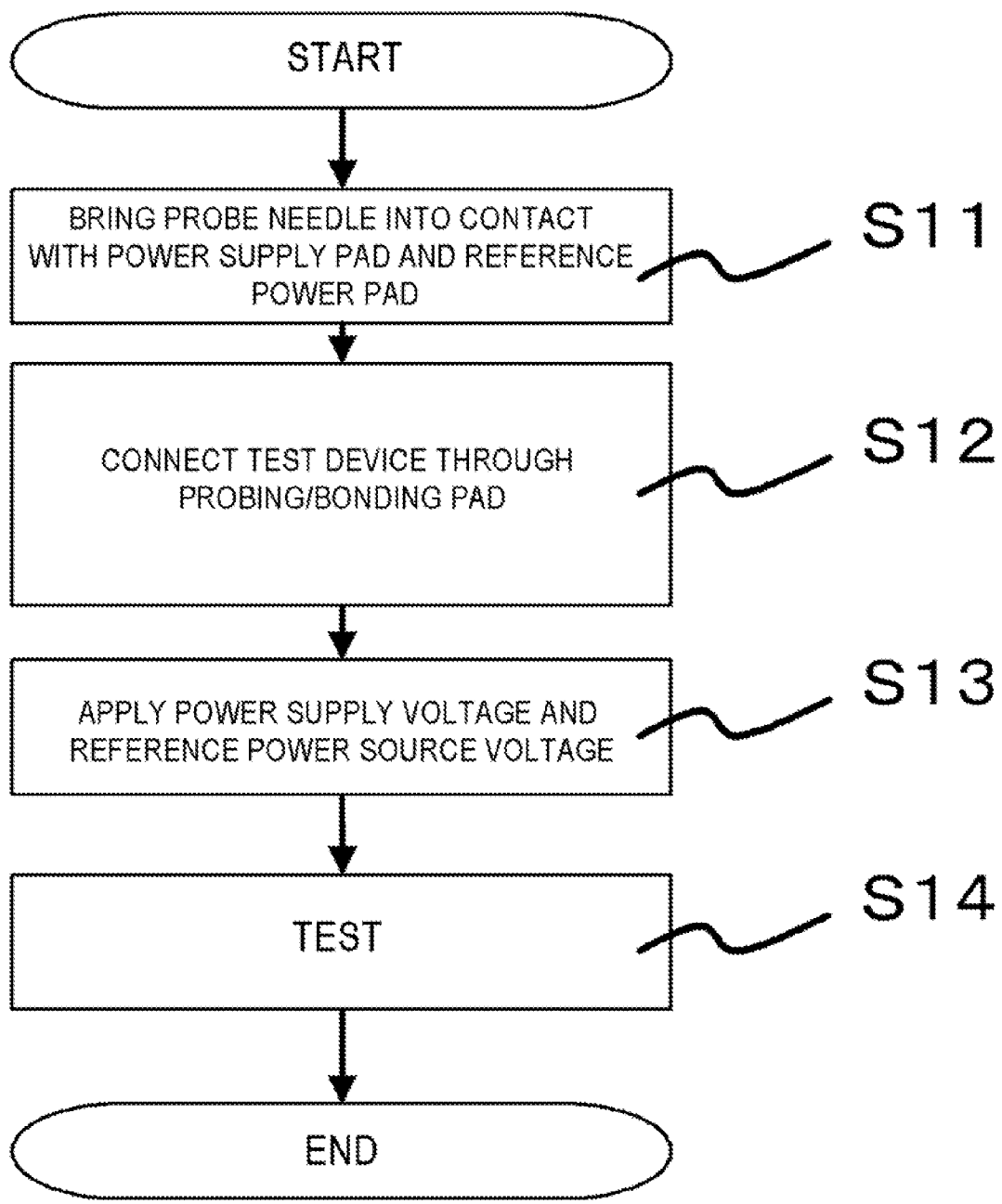
FIG. 4 is a diagram illustrating a test method of the semiconductor device.

Next, reference will be made to FIG. 4 to describe a method of testing such a semiconductor device 1.

First, the test device and the semiconductor device 1 are electrically connected to each other by bringing a probe needle into contact with the power supply pad 16 and the reference power pad 15 of the semiconductor device 1 (step S11).

Next, the test device is connected through the probing/bonding pad 19 connected to the signal input and output portion 123 of the circuit section 12 to be tested (step S12). Here, a plurality of circuit sections 12 is to be tested.

The electric power required for a test is supplied to the control circuit section 14 and the circuit section 12 from the test device through the power supply pad 16. In addition, a desired voltage in the test is applied to the control circuit section 14 from the test device through the reference power pad 15 (step S13).

Thereby, it is possible to supply necessary power to a plurality of circuit sections 12 connected to the power supply line 18 and the reference power line 17.

Specifically, since the power supply line 18 and the reference power line 17 are connected to the control circuit section 14, the electric power from the power supply line 18 and the electric power from the reference power line 17 are introduced into the control circuit section 14.

In the control circuit section 14, the voltage applied to the circuit section 12 is adjusted by comparing the supply voltage from the power supply line 18 with the supply voltage from the reference power line 17.

In this state, the test is performed by simultaneously transmitting and receiving test patterns between the test device and a plurality of circuit sections 12 (step S14).

Next, description will be made of operations and effects of the embodiment.

In the embodiment, each of the semiconductor chip forming regions 1A is provided with the circuit section 12 and the control circuit section 14 that controls the electric power supplied to the circuit section 12.

The power supply line 18 and the reference power line 17 are connected to the control circuit section 14.

The power supply line 18 is connected to the circuit section 12 through a plurality of control circuit sections 14, but the voltage of the electric power supplied from the power supply line 18 is controlled by the control circuit section 14 in accordance with the reference voltage from the reference power line 17. Therefore, it is possible to prevent the voltage applied to the circuit section 12 from deviating from a desired value.

Thereby, it is possible to prevent the accuracy of the test of the semiconductor device 1 from being lowered.

In addition, in the embodiment, since one power supply line 18 and one reference power line 17 are connected to a plurality of control circuit sections 14, it is possible to simultaneously apply a desired voltage to a plurality of circuit sections 12, and to simultaneously perform the tests of a plurality of circuit sections 12 with a high degree of accuracy.

Further, in the embodiment, since the semiconductor chip forming region 1A is provided with the control circuit section 14, it is possible to perform the test of the circuit section 12 at a different voltage, for example, by changing the reference power source voltage.

Second Embodiment

A second embodiment of the invention will be described with reference to FIGS. 5 to 10.

Figure 5:
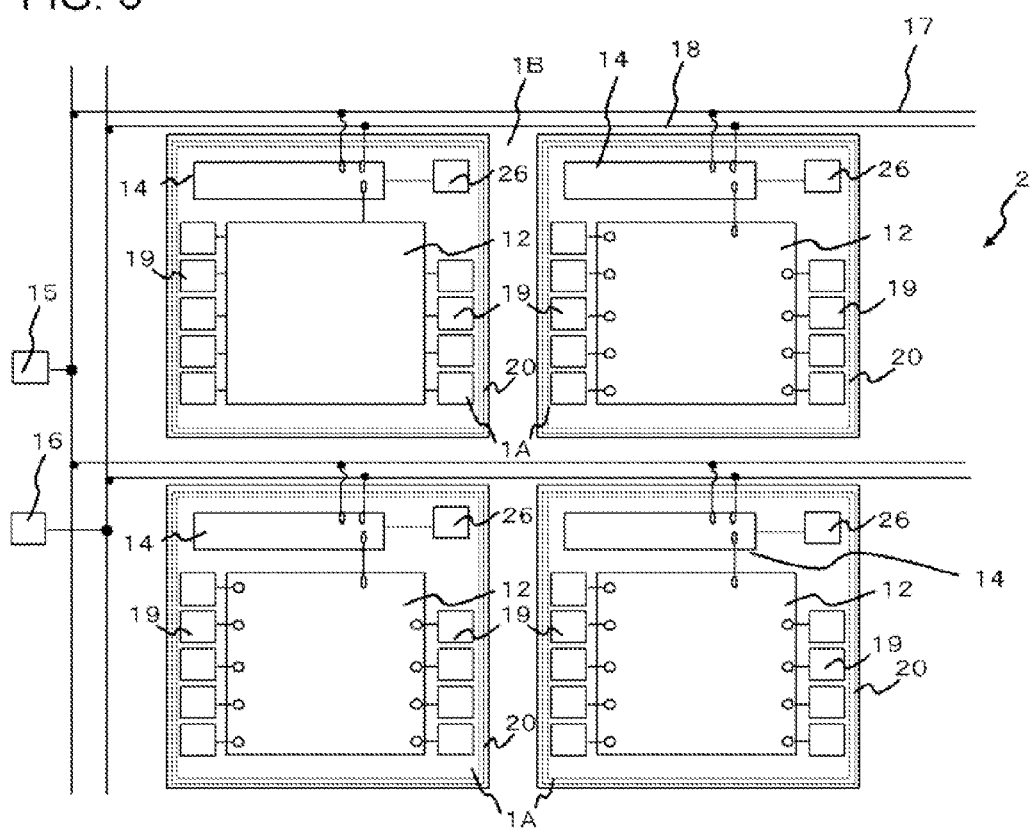
FIG. 5 is a plan view illustrating the semiconductor device according to a second embodiment of the invention.
Figure 6:
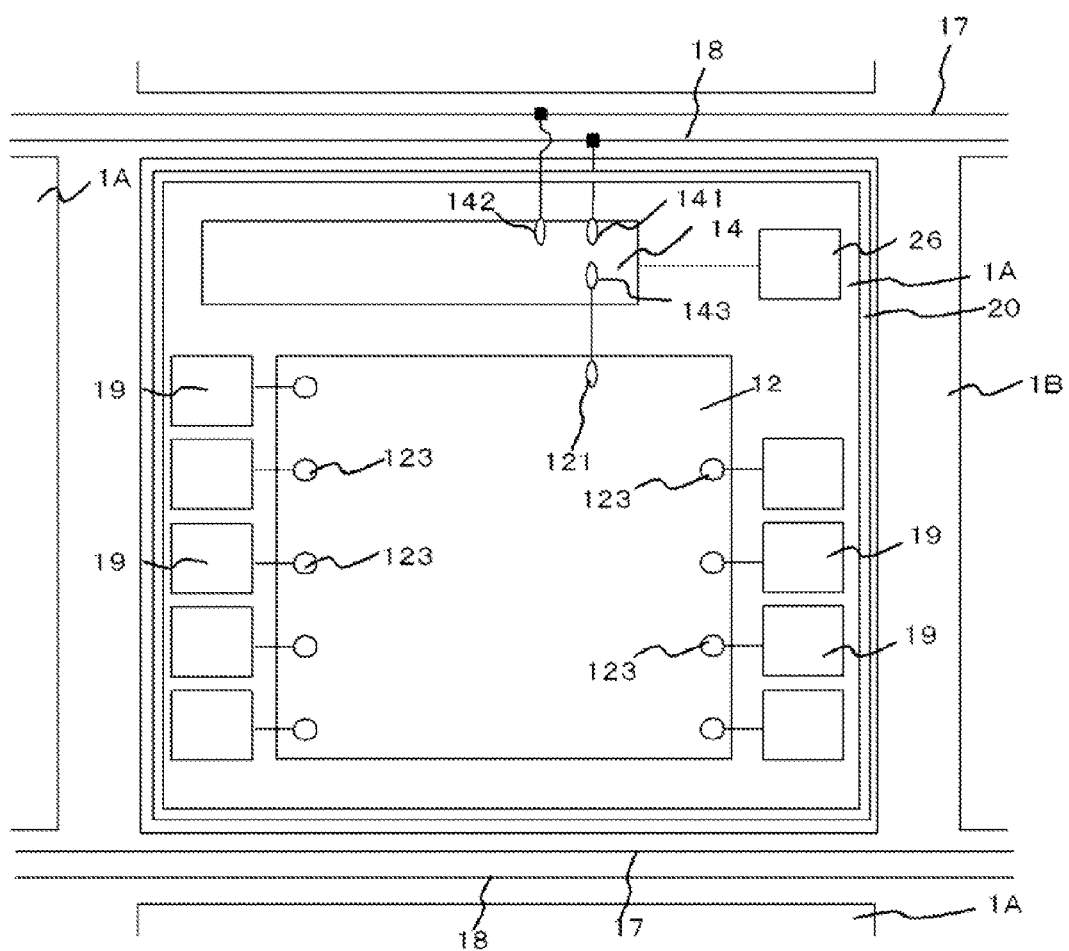
FIG. 6 is an enlarged plan view illustrating a portion of the semiconductor device.

As shown in FIGS. 5 and 6, in a semiconductor device 2 of the embodiment, each of the semiconductor chip forming regions 1A is respectively provided with a seal ring 20. In addition, a switch section 27 (see FIG. 8) and a pad 26 for power shutdown control are connected to the control circuit section 14. The others are the same as those of the above-mentioned embodiment.

The seal ring 20 is formed in a planar square frame shape so as to surround the control circuit section 14, the circuit section 12, and the switch section 27.

Figure 7:
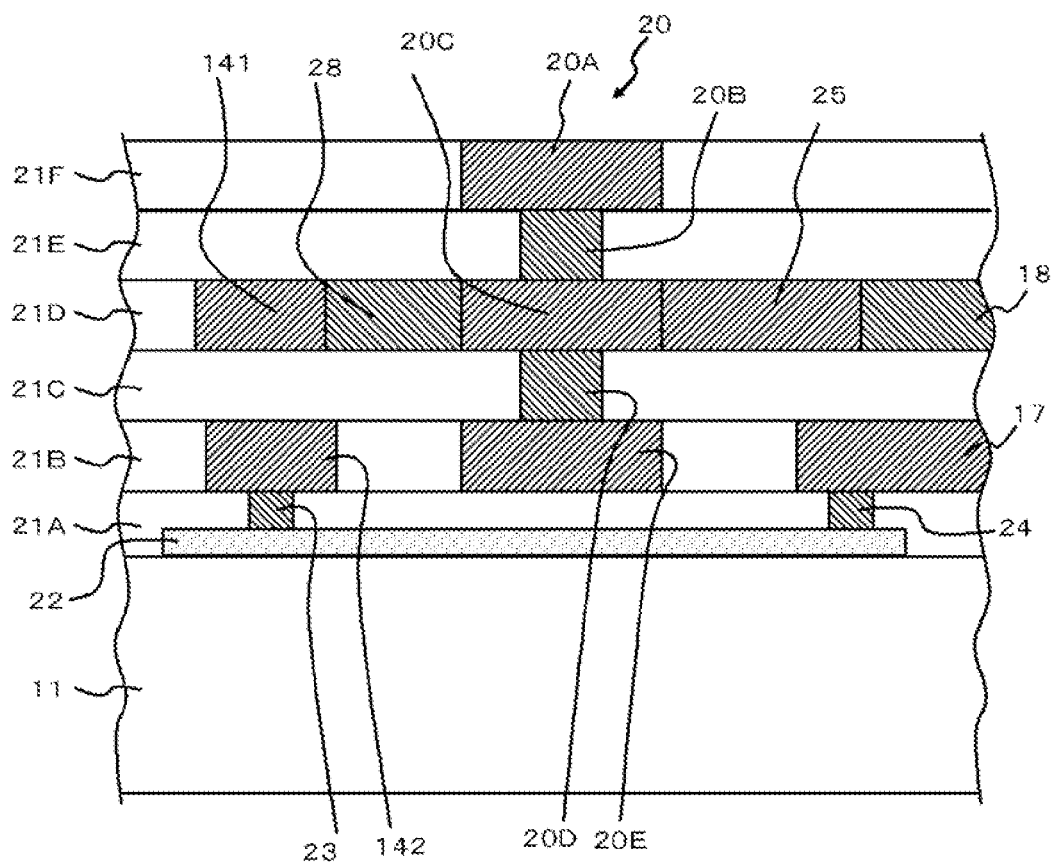
FIG. 7 is a cross-sectional view illustrating the semiconductor device.

Here, the configuration of the seal ring 20 will be described in detail with reference to FIG. 7.

A plurality of insulating interlayers 21A to 21F is laminated on the semiconductor wafer 11 of the semiconductor device 2.

Each of the insulating interlayers 21A to 21F coats the semiconductor chip forming region 1A and the dicing region 1B.

The seal ring 20 is disposed within the semiconductor chip forming region 1A, and includes metal layers 20A, 20C and 20E buried in each of the insulating interlayers, a via 20B that connects the metal layer 20A and the metal layer 20C, and a via 20D that connects the metal layer 20C and the metal layer 20E. The seal ring 20 has a configuration in which the ring-shaped metal layers 20A, 20C and 20E, and the vias 20B and 20D are laminated. All of the metal layers 20A, 20C and 20E, and the vias 20B and 20D are formed of a conductor made of, for example, a metal and the like such as copper.

The power supply line 18 is connected to the metal layer 20C of the seal ring 20 through a metal interconnect 25 serving as a lead-out interconnect.

Further, the power supply input portion 141 of the control circuit section 14 is connected to the metal layer 20C of the seal ring 20 through a metal interconnect 28 serving as a lead-out interconnect.

In addition, a polysilicon layer 22 is formed as a conductive layer in the insulating interlayer 21A of the semiconductor device 2.

The polysilicon layer 22 is formed in the insulating interlayer 21A below the insulating interlayers 21B to 21F provided with the seal ring 20. The polysilicon layer 22 is formed astride the semiconductor chip forming region 1A and the dicing region 1B, and is larger in width than one side of the seal ring 20 when seen in a plan view from the substrate surface side.

The polysilicon layer 22 extends cross the one side of the seal ring 20. The reference power input portion 142 of the control circuit section 14 is connected to the polysilicon layer 22 through a via 23, and the reference power line 17 is connected to the polysilicon layer 22 through a via 24.

The polysilicon layer 22 and the seal ring 20 are electrically insulated from each other by the insulating interlayer. As mentioned in the first embodiment, since the impedance of the reference power input portion 142 is high, a problem doesn't occur here even when the polysilicon layer 22 has a higher resistance than that of the seal ring 20.

Meanwhile, herein, the reference power line 17 is connected to the polysilicon layer 22, and the power supply line 18 is connected to the seal ring 20. However, the power supply line 18 may be connected to the polysilicon layer, and the reference power line 17 may be connected to the seal ring.

Figure 8:
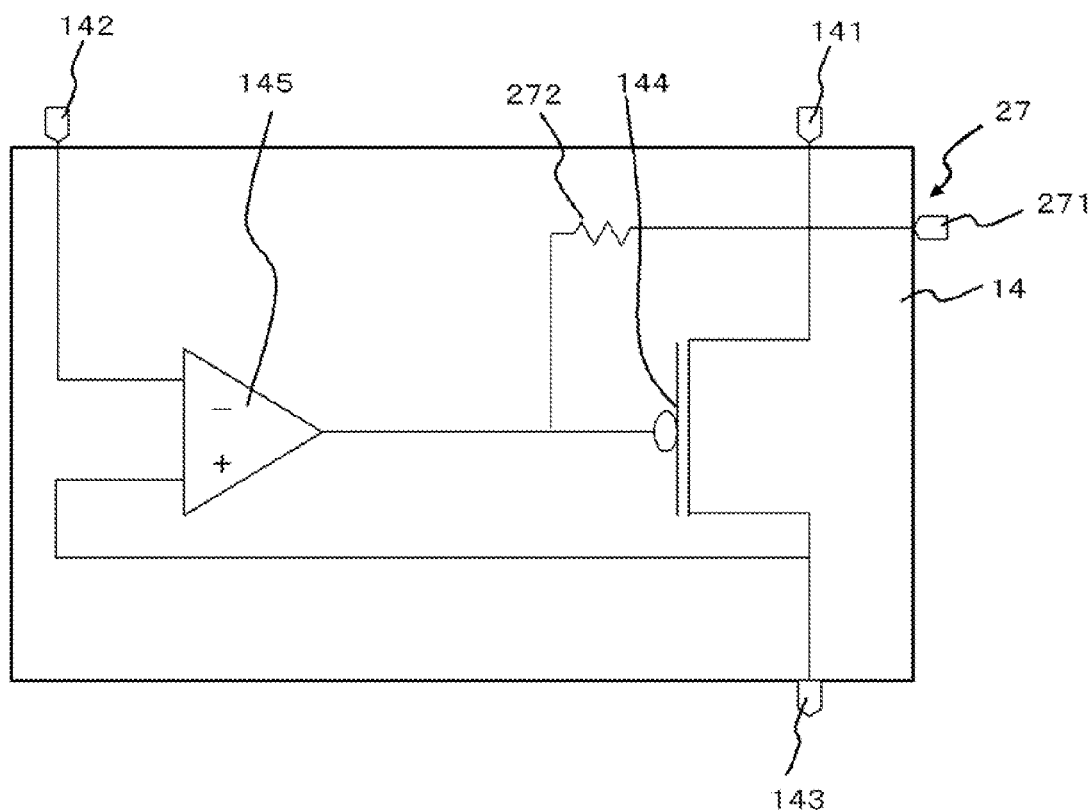
FIG. 8 is a diagram illustrating the control circuit section.

As shown in FIG. 8, the switch section 27 is connected to the control circuit section 14.

The switch section 27 includes an input portion 271 to which a predetermined signal is input, a resistor 272, and the P-type transistor 144, and is configured so that the input portion 271 and the gate terminal of the P-type transistor 144 are connected to each other through the resistor 272.

The pad 26 for power shutdown control shown in FIGS. 5 and 6 is connected to the input portion 271, and a positive voltage is applied to the gate terminal by bringing the signal input terminal into contact with the pad 26 and inputting a high-level signal to the input portion 271, whereby it is possible to turn off the P-type transistor 144. Thereby, the control circuit section 14 is shut down and the connection of the power supply line 18 and the circuit section 12 is shut down, and thus the current does not flow.

On the other hand, in the state where a signal is not input to the input portion 271, the P-type transistor 144 is turned on, and the power supply line 18 and the circuit section 12 are connected to each other through the control circuit section 14. Therefore, the voltage is controlled by the control circuit section 14, so that a predetermined voltage is applied to the circuit section 12.

Meanwhile, in the embodiment, a transistor (second transistor) constituting the switch section 27 and a transistor constituting the control circuit section 14 are formed of the same transistor (P-type transistor 144). In other words, the transistor 144 fulfills two functions of a transistor constituting the control circuit section 14 and a transistor constituting the switch section 27. As a transistor constituting the switch section 27, another transistor may be provided, without being limited thereto, between the circuit section 12 and the power supply line 18 separately from the P-type transistor 144, and the connection of the circuit section 12 and the power supply line 18 and the shutdown thereof may be controlled. In this case, the other transistor may be disposed between the circuit section 12 and the power supply line 18, for example, the other transistor may be disposed between the power supply line 18 and the control circuit section 14. In addition, the other transistor may be disposed between the control circuit section 14 and the circuit section 12.

Figure 9:
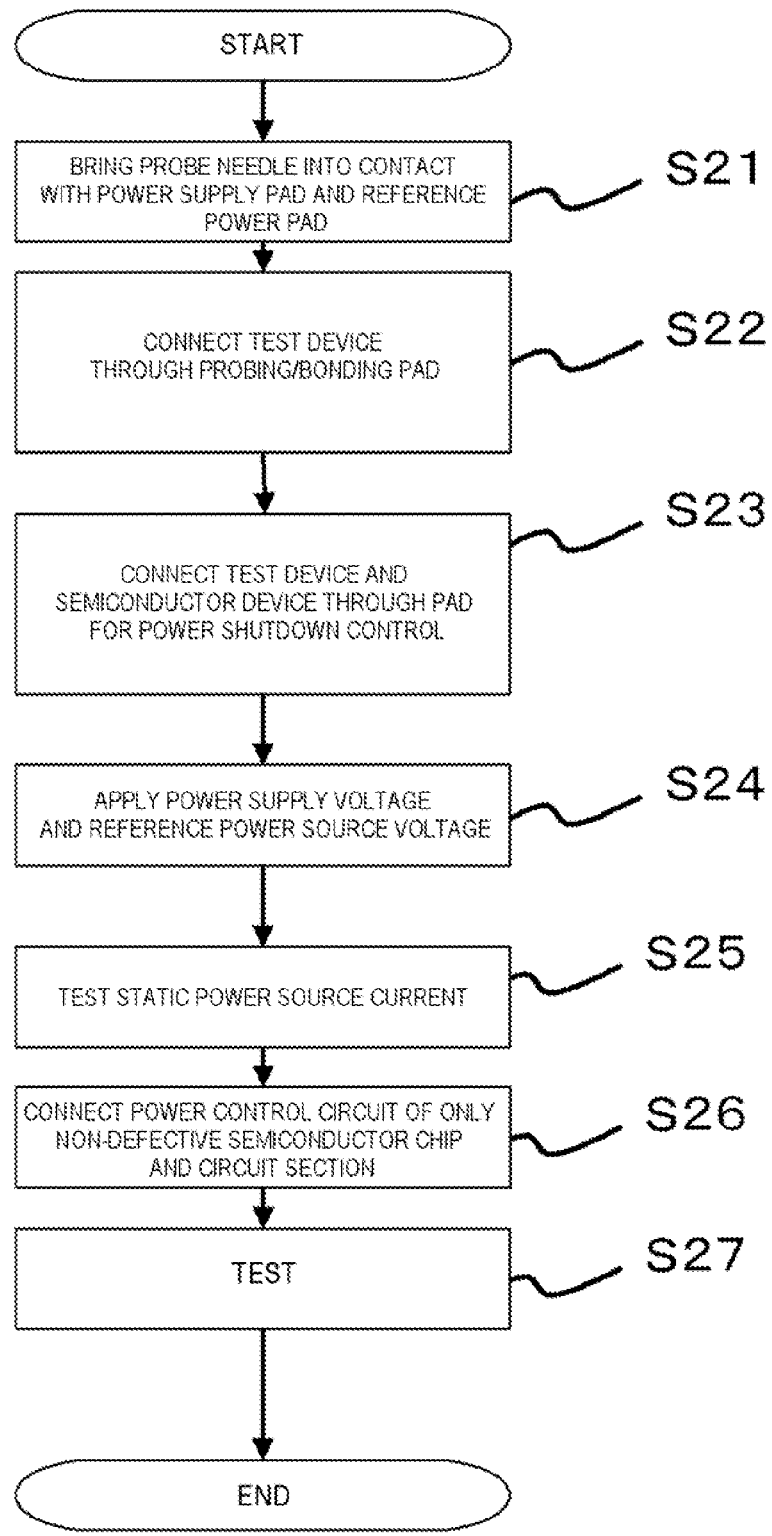
FIG. 9 is a diagram illustrating the test method of the semiconductor device.

Next, a method of testing the semiconductor device 2 of the embodiment will be described with reference to FIG. 9.

The semiconductor device and the test device are electrically connected to each other by bringing a probe needle into contact with the power supply pad 16 and the reference power pad 15 on the semiconductor wafer 11 (step S21).

In the case of the contact test method, the test device is connected through the probing/bonding pad 19 connected to the signal input and output portion 123 of the semiconductor chip to be tested (step S22).

In addition, the test device and the semiconductor device are connected to each other by bringing the signal input terminal of the test device into contact with the pad 26 for power shutdown control (step S23).

The voltage required for the test is provided to the control circuit section 14 through the power supply pad 16, and a desired voltage in the test is provided to the control circuit section 14 through the reference power pad 15 (step S24).

In this state, a static power source current test (described later) is performed, to determine the quality of each of the semiconductor chips (step S25).

Next, a signal is sent to the input portion 271 through the pad 26 for power shutdown control from the test device, and then the control circuit section 14 of a non-defective semiconductor chip is set to a connection state (state in which the power supply line 18 and the circuit section 12 are connected to each other), and the control circuit section 14 of a defective semiconductor chip is set to a shutdown state (state in which the power supply line 18 and the circuit section 12 are shutdown from each other) (step S26). Since a defective chip in which an excessive current flows is shut down from the power supply line 18, there is an effect that another semiconductor chip sharing the power supply line 18 is not influenced by the defective semiconductor chip. In this state, a function test is performed (S27).

When the function test is performed, similarly to the above-mentioned embodiment, in the control circuit section 14, the voltage applied to the circuit section 12 is adjusted by comparing the supply voltage from the power supply line 18 with the supply voltage from the reference power line 17.

Figure 10:
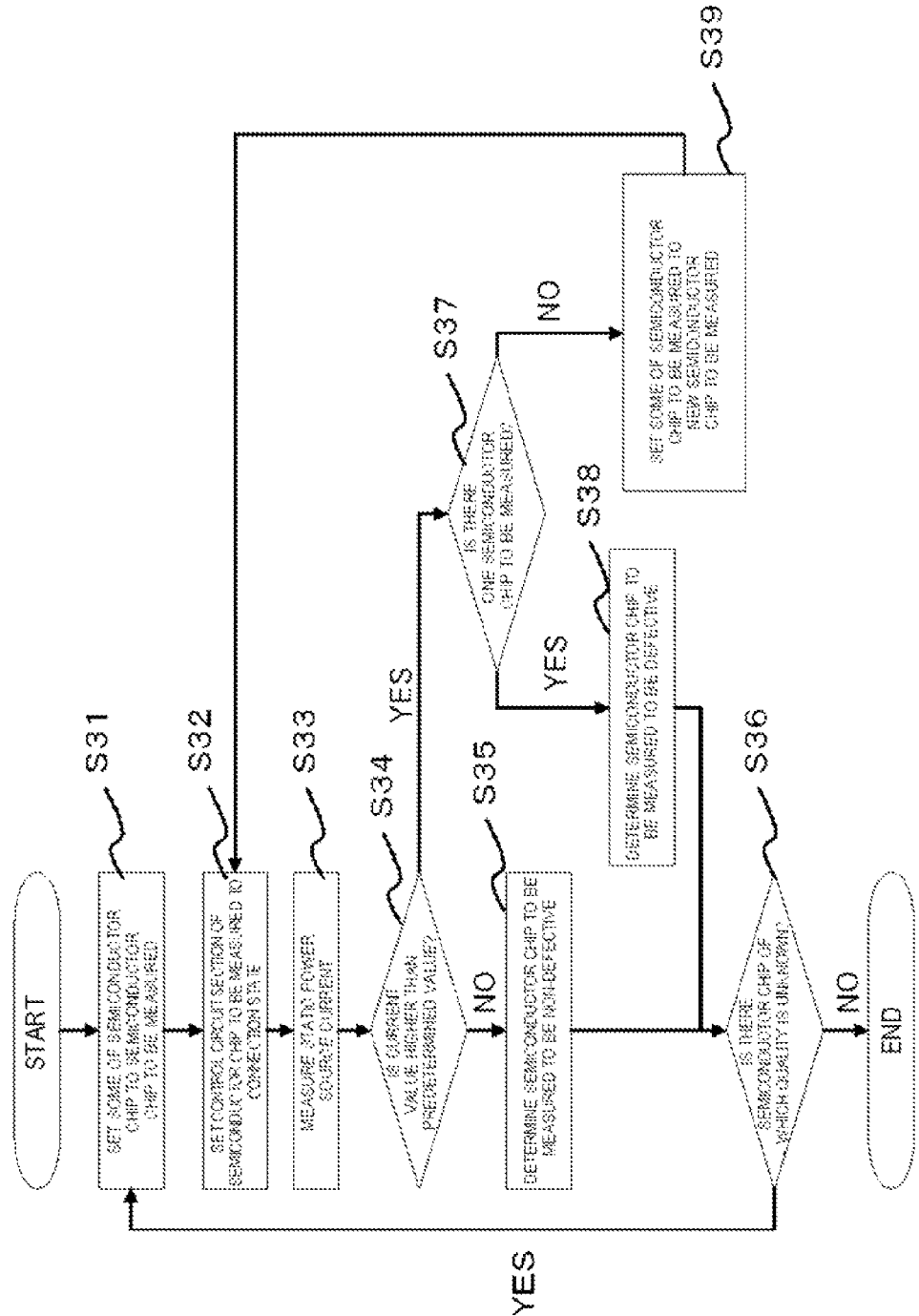
FIG. 10 is a diagram illustrating the test method of the semiconductor device.

Here, a detailed flow diagram of the static power source current test is shown in FIG. 10.

First, for example, some semiconductor chips of a plurality of semiconductor chips formed in the wafer are set to semiconductor chips to be measured (step S31). One or a plurality of semiconductor chips may be to be measured. A signal is sent to the input portion 271 through the pad 26 for power shutdown control from the test device, and then the control circuit section 14 of the semiconductor chip to be measured is set to a connection state, that is, a state in which the switch section 27 is connected, and the power supply line 18 and the circuit section 12 are connected to each other. In addition, a signal is sent to the input portion 271 through the pad 26 for power shutdown control from the test device, and then the control circuit section 14 is set to a shutdown state, that is, a state in which the switch section 27 of the semiconductor chip other than the semiconductor chip to be measured is shut down, and the power supply line 18 and the circuit section 12 are shut down from each other (step S32).

In this state, the static power source current flowing between the power supply pad 16 and the grounding line is measured (step S33), and whether the measured static power source current is higher than the normal value is determined (step S34).

When the measured static power source current has a normal value, all the measured semiconductor chips are set to a non-defective semiconductor chip (step S35).

Next, whether another semiconductor chip of which the quality is unknown exists on the semiconductor wafer is determined (step S36). In the case of existence, the flow process returns step S31 for not terminating the test, and in the case of nonexistence, the static power source current test is terminated because the test of the semiconductor chip is terminated.

On the other hand, when the measured current is determined to be higher than the normal value in step S34, it is known that one or more chips of the semiconductor chips to be measured are defective.

When there is one semiconductor chip to be measured (step S37), the one semiconductor chip is determined to be a defective semiconductor chip (step S38).

On the other hand, wren there are two or more semiconductor chips to be measured (step S37), a portion of the semiconductor chips to be measured used in the determination in step S34 is set to a new semiconductor chip to be measured in order to discriminate whether which of the semiconductor chips to be measured are defective (step S39), and the flow process returns to step S32.

Here, in step S31 of FIG. 10, when one of the semiconductor chips of which the qualities are unknown is set to a semiconductor chip to be measured, the static power source current test of one chip is possible.

After the function test is terminated, the semiconductor device 2 is diced, and a plurality of semiconductor chip is obtained. The semiconductor chip determined to be a non-defective semiconductor chip in the pre-process test is bonded between a lead frame and a bonding pad, and the entirety thereof is molded with resin or ceramic, to form a semiconductor package.

Next, the input portion 271 is given such a signal level as makes the control circuit section 14 go into a shutdown state in the state of the semiconductor package. For example, when the pad 26 for power shutdown control is connected to the input portion 271 and the input portion 271 goes into a shutdown state as a low voltage, the pad 26 for power shutdown control and the ground of the semiconductor package are connected to each other by bonding. In doing so, even when the semiconductor chip individually cut and then the end surface of the power supply line 18 appears at the wall surface of the semiconductor chip and this end surface and the pad of the semiconductor chip or the bonding at the time of packaging are short-circuited through scrap metal, the control circuit section 14 of the semiconductor chip is in a shutdown state, and thus there is an effect that the operation of the circuit section 12 is not influenced.

According to such an embodiment, it is possible to exhibit the same effect as that of the first embodiment, and to exhibit the following effect.

In the embodiment, it is possible to adjust the voltage value or the determination level in accordance with the manufactured circuit section 12 by setting the reference power source voltage to a desired voltage value. Thereby, it is possible to perform the static power source current test having a high accuracy.

Further, in the embodiment, when the switch section 27 is connected to the control circuit section 14 and the function test is performed, it is possible to set the control circuit section 14 of the non-defective semiconductor chip to be in a connection state, and to set the control circuit section 14 of the defective semiconductor chip to be in a shutdown state.

Thereby, since the defective chip in which an excessive current flows is shut down from the power supply line 18, there is an effect that another semiconductor chip sharing the power supply line 18 is not influenced by the defective semiconductor chip.

Third Embodiment

Figure 11:
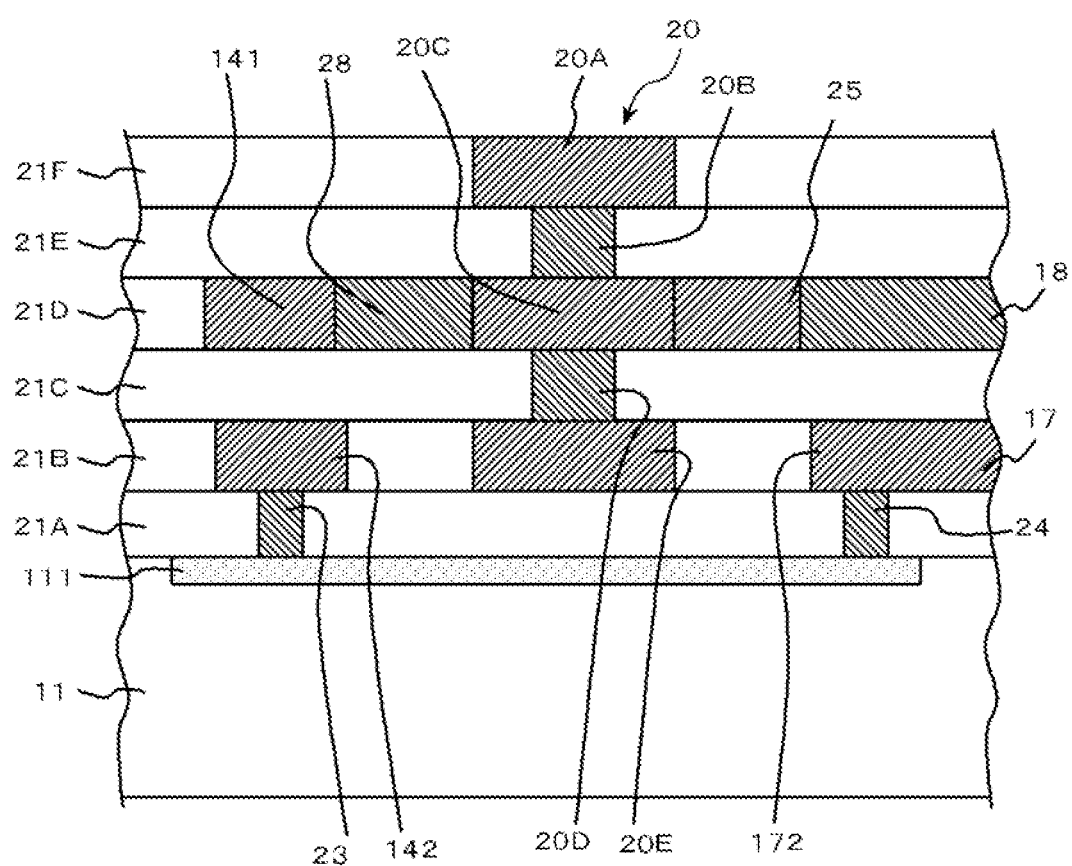
FIG. 11 is a cross-sectional view illustrating the semiconductor device according to a third embodiment of the invention.

A third embodiment of the invention will be described with reference to FIG. 11.

In the second embodiment, the reference power input portion of the control circuit section 14 and the reference power line are connected to the polysilicon layer 22.

On the other hand, in the embodiment, the reference power input portion 142 of the control circuit section 14 and the reference power line 17 are connected to a diffusion layer 111 formed in the surface of the semiconductor wafer 11. The others are the same as those of the second embodiment.

To be described in more detail, the diffusion layer 111 is formed as a conductive layer in the surface of the semiconductor wafer 11 such as a silicon substrate so as to traverse one side of the seal ring 20. The diffusion layer 111 is formed in the semiconductor wafer 11 by diffusing, for example, an n-type impurity. The diffusion layer 111 is formed astride the semiconductor chip forming region 1A and the dicing region 1B, and is larger than the width of one side of the seal ring 20 (dimension in the direction perpendicular to the extension direction thereof).

The reference power input portion 142 of the control circuit section 14 and the reference power line 17 are connected to the diffusion layer 111 through the vias 23 and 24. The diffusion layer 111 and the seal ring 20 are insulated from each other by the insulating interlayer 21A provided below the seal ring 20.

Since the impedance of the reference power input portion 142 is high, there is no problem even when the diffusion layer 111 has a higher resistance than that of the seal ring 20.

According to such an embodiment, it is possible to exhibit the same effect as that of the second embodiment.

Meanwhile, here, although the reference power line 17 is connected to the diffusion layer 111 and the power supply line 18 is connected to the seal ring 20, the power supply line 18 may be connected to the diffusion layer 111, and the reference power line 17 may be connected to the seal ring.

Fourth Embodiment

Figure 13:
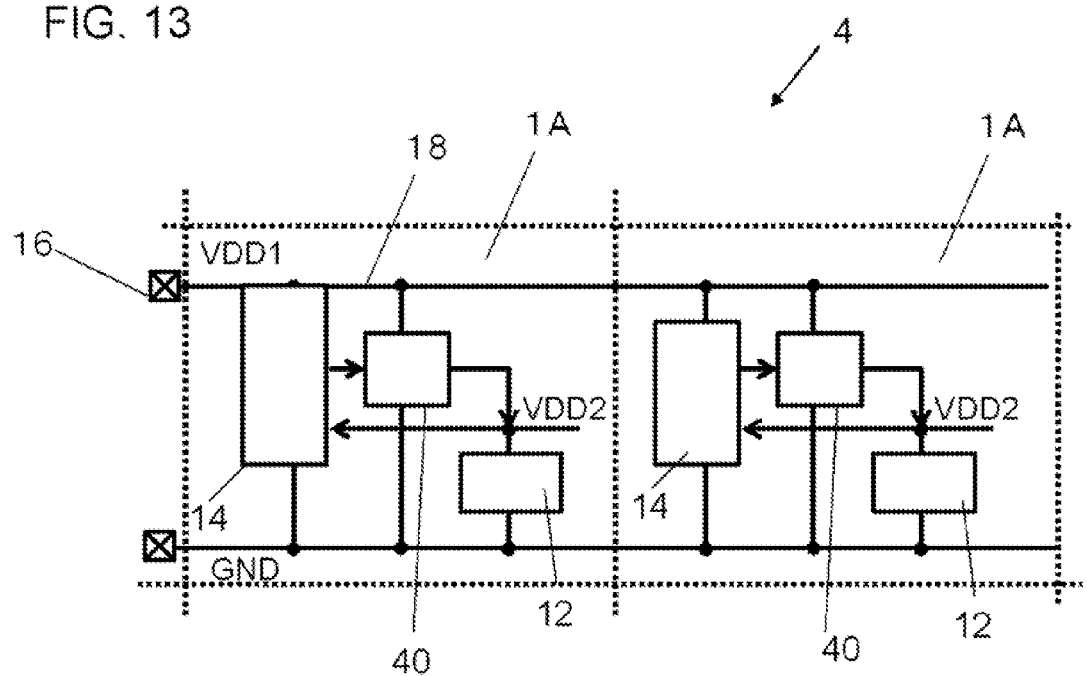
FIG. 13 is a schematic diagram illustrating the semiconductor device according to a fourth embodiment of the invention.

Next, a fourth embodiment of the invention will be described with reference FIGS. 13 and 14.

A semiconductor device 4 of the embodiment includes a current detecting element 40 used in the measurement of the value of the current flowing in the circuit section 12.

The current detecting element may be present within at least one semiconductor chip forming region, and may each be present within a plurality of semiconductor chip forming regions. In addition, the current detecting element may be present within all the semiconductor chip forming regions. The same is true of embodiments described later.

The others are the same as those of the first embodiment. Meanwhile, the present embodiment may have the same configuration as that of the second embodiment or the third embodiment.

First, an outline of the embodiment will be described.

In the embodiment, a measurement unit that measures the value of the current flowing in the circuit section 12 of the semiconductor device 4 is constituted by the current detecting element 40 of the semiconductor device 4 and an external measurement device M. The control circuit section 14 of the semiconductor device 4 includes the power supply output portion 143 for outputting electric power from the power supply line 18 to the circuit section 12, and the current detecting element 40 includes a resistor element 41 of which one end is connected to the power supply output portion 143 of the control circuit section 14 and of which the other end is connected to the circuit section 12, and a detection section 421 that detects the potential difference generated between the ends of the resistor element 41. The external measurement device M calculates the value of the current flowing in the circuit section 12 from the potential difference generated between the ends of the resistor element 41 detected in the detection section 421 and the resistance value of the resistor element 41, on the basis of Ohm's law.

Next, the embodiment will be described in detail.

The current detecting element 40 is disposed within each of the semiconductor chip forming regions 1A.

The current detecting element 40 is disposed between the control circuit section 14 and the circuit section 12, and is used in measuring the value of the current supplied from the control circuit section 14 to the circuit section 12. In the embodiment, the current detecting element 40 is serially connected between the output of the control circuit section 14 and the circuit section 12.

Figure 14:
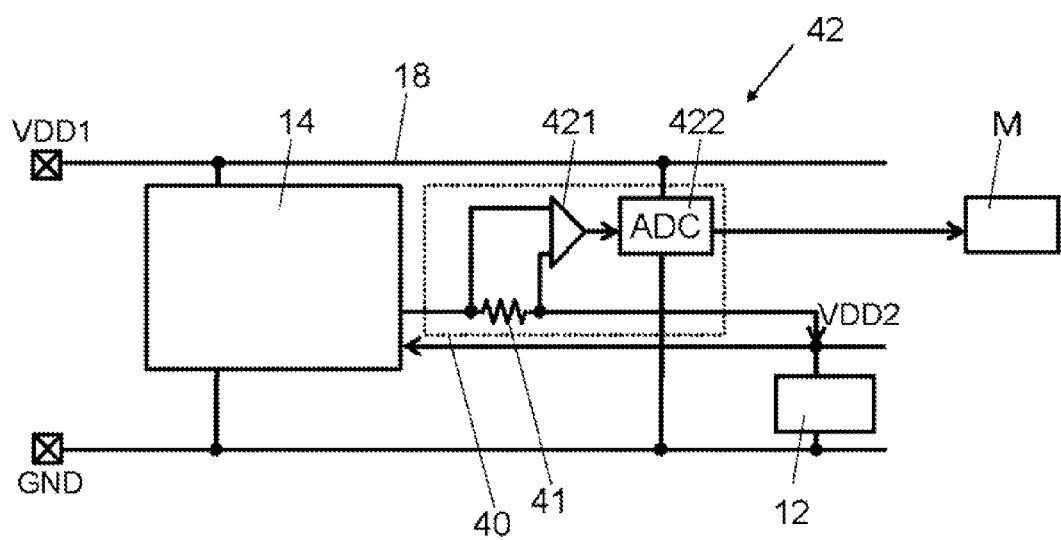
FIG. 14 is a schematic diagram illustrating a main section of the semiconductor device according to the fourth embodiment of the invention.

The current detecting element 40 includes the resistor element 41 and a measurement section 42 as shown in FIG. 14.

The resistor element 41 is configured so that one end thereof is connected to the power supply output portion 143 of the control circuit section 14 and the other end thereof is connected to the circuit section 12.

The measurement section 42 includes the detection section (amplifier) 421 that detect the potential difference generated between a pair of ends of the resistor element 41, and an analog-to-digital converter circuit 422 connected to the amplifier 421.

The current from the control circuit section 14 is caused to flow to the resistor element 41, the potential difference generated between the ends of the resistor element 41 is detected in the amplifier 421, and amplification is performed. The potential difference is converted into a digital value by the analog-to-digital converter circuit 422.

The analog-to-digital converter circuit 422 is connected to the external measurement device M, and the external measurement device M calculates the value of the current flowing in the circuit section 12 from the potential difference between the ends of the resistor element 41 and the resistance value of the resistor element 41.

Meanwhile, there may be an aspect of the current measurement in which the current value is directly calculated from the potential difference between both ends of the resistor element 41 without involving the analog-to-digital converter circuit 422, or the current value is directly calculated from the voltage value after amplification without involving the analog-to-digital converter circuit 422.

According to such a fourth embodiment, it is possible to exhibit the same effect as that of the above-mentioned embodiment, and to exhibit the following effect.

As mentioned in the third embodiment, in the test of the semiconductor device 1, there is a test in which the current flowing in the circuit section 12 is measured, and the quality thereof is determined (static power source current test).

Since a plurality of circuit sections 12 is connected to the power supply line 18, only the sum total of the current flowing in a plurality of circuit sections 12 can be measured in the power supply pad 16 even when the current value is measured by using the power supply pad 16. Therefore, the current flowing for each circuit section 12 cannot be rapidly discriminated.

On the other hand, in the embodiment, since the current detecting element 40 is provided for each circuit section 12, the current flowing in each of the circuit sections 12 is grasped, thereby allowing the qualities of the circuit sections 12 to be determined.

In addition, in the embodiment, the current detecting element 40 may be disposed between the control circuit section 14 and the circuit section 12, and thus the configuration of the semiconductor device can be made very simple.

Fifth Embodiment

Figure 15:
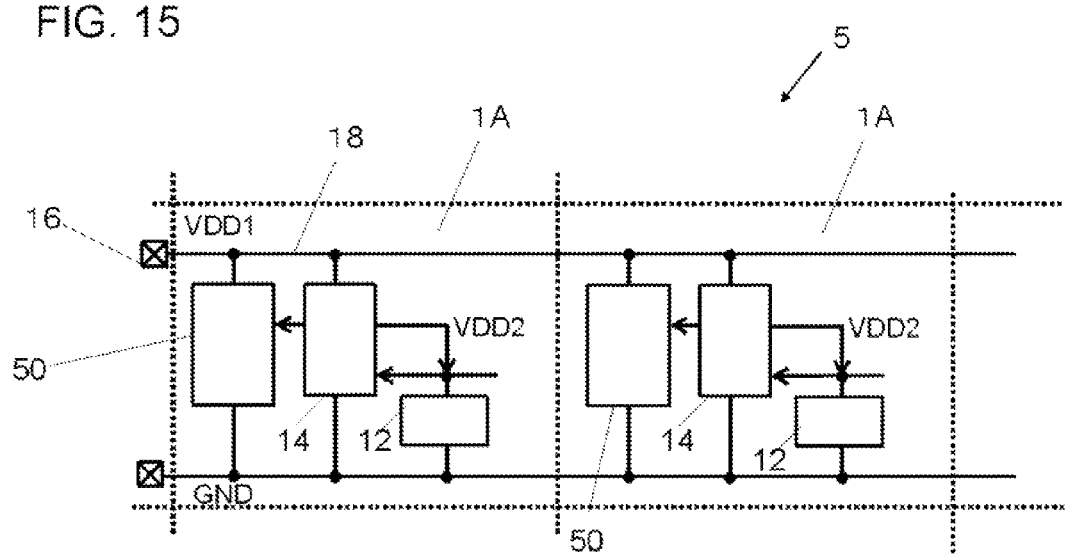
FIG. 15 is a schematic diagram illustrating the semiconductor device according to a fifth embodiment of the invention.

A fifth embodiment of the invention will be described with reference to FIGS. 15 and 16.

A semiconductor device 5 of the embodiment includes a current detecting element 50 used in measuring the value of the current flowing in the circuit section 12.

The others are the same as those of the first embodiment. Meanwhile, the present embodiment may have the same configuration as that of the second embodiment or the third embodiment.

An outline of the embodiment will be described.

In the embodiment, a measurement unit that measures the value of the current flowing in the circuit section 12 of the semiconductor device 5 is constituted by the current detecting element 50 of the semiconductor device 5 and the external measurement device M.

The current detecting element 50 includes a transistor 51, a resistor element 52 connected to the transistor 51 in series, and a detection section 53 that detects the voltage applied to the resistor element 52. The same voltage as the voltage applied to a gate electrode of the transistor 144 of the control circuit section 14 is applied to a gate electrode of the transistor 51, and the current from the transistor 51 flows in the resistor element 52.

On the other hand, the ratio of the current flowing in the transistors 51 and 144 in the gate voltage applied to the gate electrode of the transistor 144 and the resistance value of the resistor element 52 are stored in the external measurement device M. In addition, the external measurement device M detects the potential difference between both ends of the resistor element 52 when the current from the transistor 51 flows. The external measurement device M calculates the value of the current flowing in the transistor 144 on the basis of the potential difference between both ends of the resistor element 52, the resistance value of the resistor element 52, and the ratio of the current of the transistors 51 and 144.

Next, the embodiment will be described in detail.

The current detecting element 50 is connected to the control circuit section 14, and is not connected directly to the circuit section 12. In the current detecting element 50, it is a feature of the embodiment to set an internal signal of the control circuit section 14 to an input. In the embodiment, the current detecting element 50 detects a gate voltage of the P-type transistor 144 of the control circuit section 14. The value of the current flowing in the circuit section 12 can be grasped on the basis of design data and the detected gate voltage of the P-type transistor 144.

More detailed description will be made with reference to FIG. 16.

Figure 16:
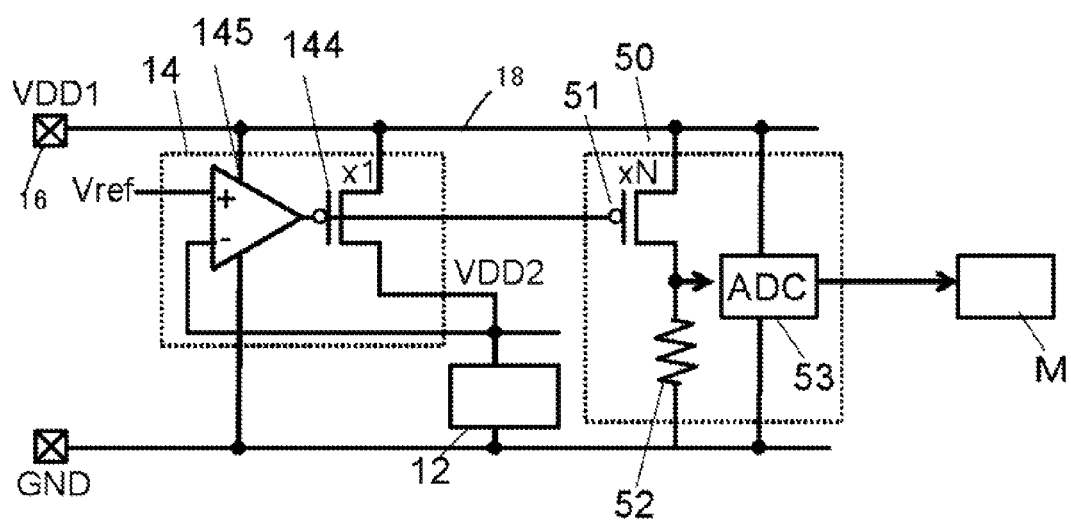
FIG. 16 is a schematic diagram illustrating a main section of the semiconductor device according to the fifth embodiment of the invention.

As shown in FIG. 16, the current detecting element 50 includes the transistor 51, the resistor element 52, and the analog-to-digital converter circuit 53.

The transistor 51 is a PMOS transistor, and the operational amplifier 145 of the control circuit section 14 is connected to the gate terminal (gate electrode). In other words, the same voltage as the voltage applied to the gate terminal of the P-type transistor 144 of the control circuit section 14 is applied to the gate terminal of the transistor 51.

A source terminal of the transistor 51 is connected to the power supply line 18, and a drain terminal thereof is connected to the resistor element 52.

The current from the transistor 51 flows in the resistor element 52. That is, the current having the same amount as the current flowing between the source terminal and the drain terminal of the transistor 51 flows in the resistor element 52. At this time, the potential difference is generated between both ends of the resistor element 52.

The analog-to-digital converter circuit (detection section) 53 detects the potential difference between both ends of the resistor element 52, and converts it into a digital value.

The digital value obtained in the analog-to-digital converter circuit 53 is sent to the external measurement device M.

Here, the resistance value of the resistor element 52 is stored in the external measurement device M. The resistance value of the resistor element 52 is previously grasped at the time of the design. In the external measurement device M, the current value is calculated on the basis of Ohm's law from the resistance value and the potential difference between both ends of the resistor element 52 obtained through the analog-to-digital converter circuit 53. This current value corresponds to the current flowing in the transistor 51.

Further, the characteristics of the transistor 51 and the characteristics of the transistor 144 (specifically, the ratio of the current of two transistors 51 and 144 in the specific gate voltage (gate voltage applied to the transistor 51 when the current is caused to flow to the resistor element 52)) are stored in the external measurement device M. The characteristics of the transistor 51 and the characteristics of the transistor 144 can be grasped at the time of the design.

In the external measurement device M, the current value flowing in the transistor 144, that is, the current value flowing in the circuit section 12 can be calculated from the current value calculated from the potential difference between both ends of the resistor element 52 and the ratio of the current of the transistor 51 and the transistor 144 in the specific gate voltage.

Meanwhile, when the manufacturing variation is greatly generated between the characteristics of the transistor and the like which can be grasped at the time of the design and the characteristics of the manufactured transistor, the relationship between the resistor element 52 and the value of the current flowing in the circuit section 12 may be previously grasped, and the value of the current flowing the circuit section 12 may be calculated using this relationship.

According to such an embodiment, it is possible to exhibit the same effect as that of the fourth embodiment, and to exhibit the following effect.

In the fourth embodiment, since the resistor element 41 is inserted between the power supply output portion 143 of the control circuit section 14 and the circuit section 12, the reduction in the voltage proportional to the current flowing in the resistor element 41 occurs inevitably. Thereby, the voltage margin (potential difference between the power supply line 18 and the power supply output portion 143 of the control circuit section 14) of the control circuit section 14 has to be reduced, and thus there may be a possibility of causing a difficult design of the control circuit section 14. On the other hand, in the embodiment, since the resistor element 41 is not inserted, it is possible to perform the current measurement while maintaining the voltage margin of the control circuit section 14. Therefore, it is possible to prevent the design of the control circuit section 14 from becoming difficult.

Sixth Embodiment

Figure 17:
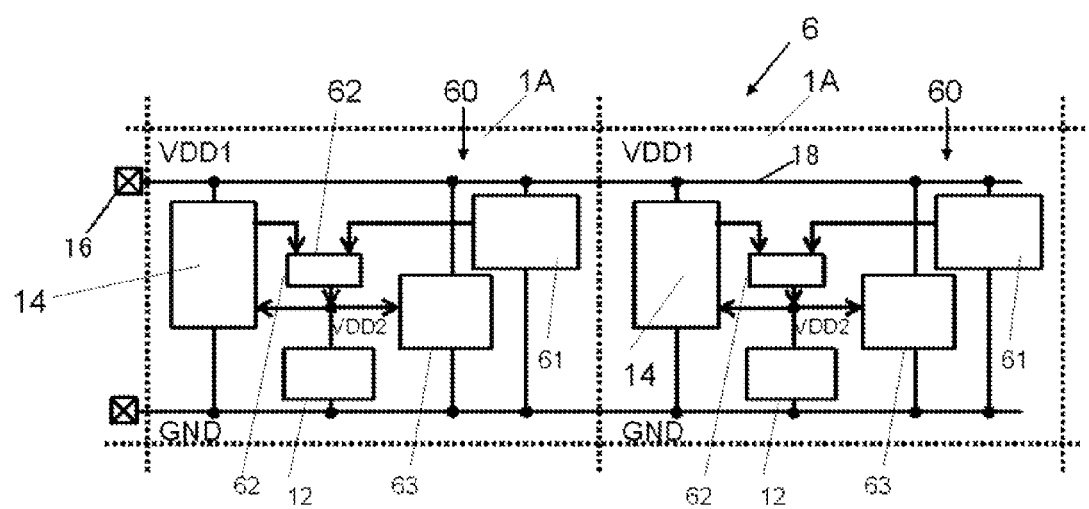
FIG. 17 is a schematic diagram illustrating the semiconductor device according to a sixth embodiment of the invention.
Figure 18:
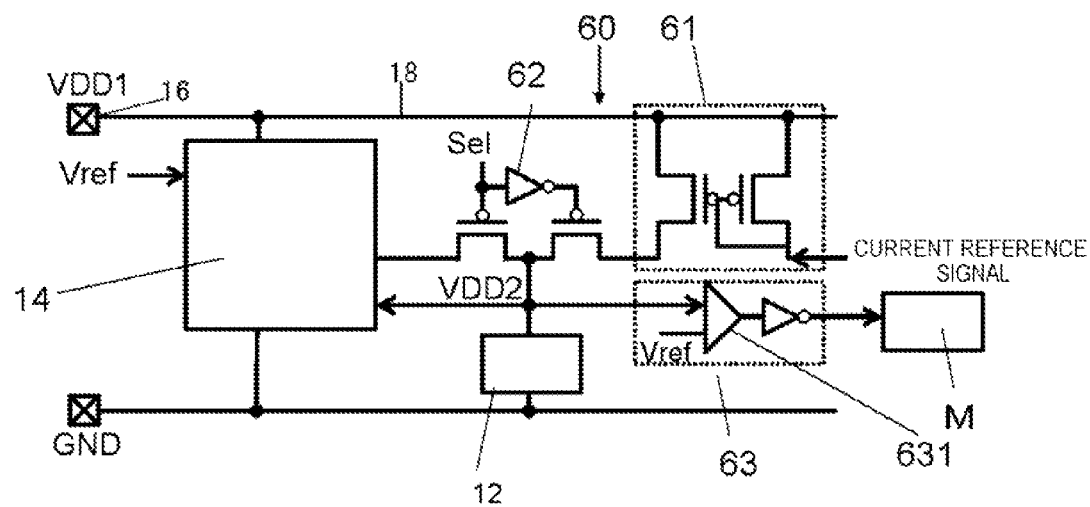
FIG. 18 is a schematic diagram illustrating a main section of the semiconductor device according to the sixth embodiment of the invention.

A sixth embodiment of the invention will be described with reference to FIGS. 17 and 18.

A semiconductor device 6 of the embodiment includes a current detecting element 60 for measuring the value of the current flowing in the circuit section 12.

The others are the same as those of the first embodiment. Meanwhile, the present embodiment may have the same configuration as that of the second embodiment or the third embodiment.

First, an outline of the embodiment will be described.

In the embodiment, a measurement unit that measures the value of the current flowing the circuit section 12 of the semiconductor device 6 is constituted by the current detecting element 60 of the semiconductor device 6 and the external measurement device M.

The current detecting element 60 includes a current source 61 that causes a predetermined amount of current to flow to the circuit section 12, a switch section 62 for connecting the power input portion 121 of the circuit section 12 to the current source 61 or the control circuit section 14, and a comparator 631 that detect a voltage applied to the power input portion 121 of the circuit section 12 in a state where the power input portion 121 of the circuit section 12 is connected to the current source 61 by the switch section 62, and compares the detected voltage with the reference voltage.

The current of a different amount of current is supplied from the current source 61 to the circuit section 12, and the external measurement device M acquires and stores the amount of the current flowing from the current source 61 to the circuit section 12 and the comparison result (result regarding which of the voltage applied to the power input portion 121 of the circuit section 12 and the reference voltage is larger) in the comparator 631.

The external measurement device M detects a point (that is, a point in time at which the voltage applied to the power input portion 121 of the circuit section 12 becomes the same voltage value as the reference voltage) switched from a state where one of the voltage applied to the power input portion of the circuit section 12 and the reference voltage is large to a state where the other is large. The amount of the current from the current source 61 at the switched point in time is grasped.

Next, the embodiment will be described in detail.

The current detecting element 60 includes the current source 61 that causes a predetermined amount of current to flow to the circuit section 12, the switch section 62 for connecting the circuit section 12 to the current source 61 or the control circuit section 14, and a detection section 63.

The current source 61 can cause an arbitrary current to flow to the circuit section 12, and includes a current mirror circuit constituted by a P-type MOS transistor. The current is amplified by the current mirror circuit on the basis of a current reference signal, and desired current flows to the circuit section 12.

The switch section 62 is constituted by two P-type transistors and an inverter, and connects either the output section of the control circuit section 14 or the output section of the current source 61 to the power input portion 121 of the circuit section 12 in response to a selection signal (SEL) from the outside.

The detection section 63 detects a voltage applied to the power input portion 121 of the circuit section 12, and compares the detected voltage value with the above-mentioned reference voltage. When the detected voltage value is lower than the reference voltage, a signal of Low is transmitted to the external measurement device M. In addition, when the detected voltage value is higher than the reference voltage, a signal of High is transmitted to the external measurement device M.

The detection result (signal of Low or High) detected in the detection section 63 is sent to the external measurement device M.

Next, procedures of measuring the value of the current flowing to the circuit section 12 in the semiconductor device 6 will be described.

First, a signal is sent from the outside to the switch section 62 so that the connection of the control circuit section 14 and the circuit section 12 is shut down and the current source 61 and the circuit section 12 are connected to each other. Thereby, the current source 61 and the circuit section 12 are connected to each other through the switch section 62 (step S70).

Thereafter, a current reference signal is sent from the outside to the current source 61, and a predetermined amount of current flows from the current source 61 through the switch section 62 to the circuit section 12 on the basis of this signal (step S71).

In the detection section 63, a voltage applied to the power input portion 121 of the circuit section 12 is detected, and comparison of the detected voltage value with the reference voltage is performed by the voltage comparator 631. The detection result is transmitted to the external measurement device M (step S72).

In the external measurement device M, the detection result and the amount of the current flowing from the current source 61 to the circuit section 12 are associated with each other and the association is stored.

Next, the current is caused to flow to the circuit section 12 by changing the amount of the current from the current source 61 (step S73).

In the detection section 63, the voltage applied to the power input portion 121 of the circuit section 12 is detected, and comparison of the detected voltage value with the reference voltage is performed by the voltage comparator 631. The reference voltage is input to the voltage comparator 631. The detection result is transmitted to the external measurement device M. In the external measurement device M, the detection result and the amount of the current flowing from the current source 61 to the circuit section 12 are associated with each other and the association is stored (step S74).

Such processes (steps S73 to S74) are repeated multiple times, and a point at which the signal from the voltage comparator 631 is switched between High and Low is detected in the external measurement device M. The point at which the signal from the voltage comparator 631 is switched between High and Low is a point at which the amount of the current flowing from the current source 61 to the circuit section 12 becomes approximately equal to the amount of the current flowing the control circuit section 14 to the circuit section 12. It is possible to grasp the current value flowing from the control circuit section to the circuit section 12 by detecting the amount of the current from the current source 61 in the point at which the signal from the voltage comparator 631 is switched between High and Low.

For example, the amount of the current in the point at which the signal from the voltage comparator 631 is switched from High to Low can be grasped by taking an average value between the amount of the current from the current source 61 at the time of the signal of High just before switched to Low and the amount of the current from the current source 61 at the time of the signal of Low just after switched from High to Low.

According to the embodiment mentioned above, it is possible to exhibit the same effect as that of the fifth embodiment, and to exhibit the following effect.

In the fourth embodiment and the fifth embodiment, the current value is calculated on the basis of the amount of the voltage drop shown in the resistor elements 41 and 52. However, for example, when the minute current is measured as in the leakage current measurement, it is necessary to prepare the resistor elements 41 and 52 having a large resistance value in order to obtain the amount of the voltage drop sufficient for the measurement. However, the resistor element having a large resistance value has a large element area, which leads to an increase in the chip cost.

On the other hand, in the embodiment, it is possible to measure a small current value in the circuit having a small area by using the current mirror circuit and the voltage comparator 631 instead of the resistor element.

Meanwhile, the invention is not limited to the above-mentioned embodiments, but changes and modifications within the range capable of achieving the object of the invention are included in the invention.

For example, in each of the above-mentioned embodiments, when the test of the semiconductor chip is performed, the test is performed by bringing the probe of the test device into contact with the probing/bonding pad 19. However, the test is not limited thereto, and may be performed by, for example, a noncontact method. For example, a noncontact input and output circuit is included in the inside of the semiconductor circuit, and the signal from the test device may be received through the noncontact probes such as a magnetic probe or a capacitive probe.

In addition, in the second embodiment and the third embodiment, the switch section 27 connected to the control circuit section 14 is connected to the pad 26 provided within the semiconductor chip forming region 1A, and the signal is input to the switch section 27 through the pad 26 by bringing the signal input terminal into contact with the pad 26. The configuration is not limited thereto.

Figure 12:
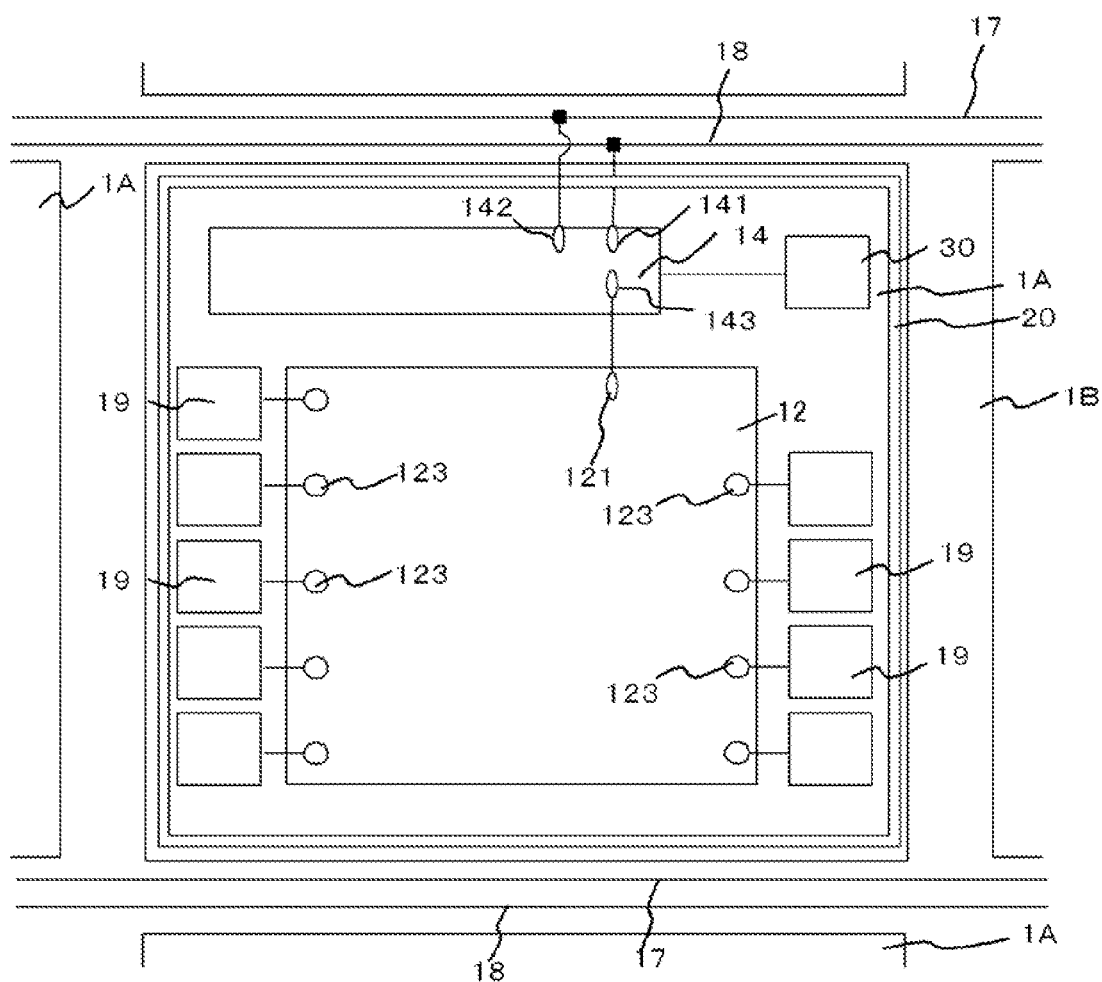
FIG. 12 is a plan view illustrating the semiconductor device according to a modified example of the invention.

For example, as shown in FIG. 12, the noncontact signal receiving circuit 30 is provided instead of the pad 26. This noncontact signal receiving circuit 30 is a circuit that receives the signal from the test device by capacitive coupling or inductive coupling (electromagnetic induction). The signal is input to the switch section 27 through the noncontact signal receiving circuit 30, and the control circuit section 14 is shut down.

In this way, it is possible to reduce the number of the contact points of the test device with the semiconductor device, to prevent abrasion and the like of the contact terminal, and to reduce the test costs.

In addition, in each of the above-mentioned embodiment, the power supply line 18 is connected to all of a plurality of control circuit sections 14 connected to the reference power line 17, but the configuration is not limited thereto. For example, the reference power line may be connected to a portion of a plurality of control circuit sections of a plurality of control circuit sections connected to the power supply line, and the reference power line may be connected to the other portion of the control circuit sections. For example, the reference power line may not be connected to the control circuit section within the semiconductor chip forming region located at the position difficult to give rise to the voltage drop by disposing the power supply line.

The application is the National Phase of PCT/JP2009/007125, filed Dec. 22, 2009, which claims priority from Japanese Patent Application No. 2008-333117 filed on Dec. 26, 2008, the content of which is incorporated herein by reference in its entirety.

The invention claimed is:

1. A semiconductor device comprising:
   a semiconductor wafer in which a plurality of semiconductor chip forming regions is formed;
   a plurality of circuit sections which is respectively provided within each of the semiconductor chip forming regions of said semiconductor wafer;
   a plurality of control circuit sections, provided within each of said semiconductor chip forming regions and respectively connected to each of said circuit sections, that controls electric power supplied to said circuit section;
   a power supply line connected to a plurality of said control circuit sections; and
   a reference power line connected to a plurality of said control circuit sections,
   wherein a voltage of electric power supplied from said power supply line is controlled in said control circuit section on the basis of a reference voltage from said reference power line.

2. The semiconductor device as set forth in claim 1,
   wherein a reference power input portion to which electric power from said reference power line is input,
   a power supply input portion to which electric power from said power supply line is input, and
   a power supply output portion for outputting electric power from said power supply line to said circuit section are formed in said control circuit section,
   wherein said control circuit section includes
   an arithmetic unit that calculates the difference between a reference voltage applied to said reference power input portion and a voltage applied to said power supply output portion, and
   a transistor which is connected to said arithmetic unit, disposed between said power supply output portion and said power supply input portion, and connected to said power supply output portion and said power supply input portion,
   wherein in said arithmetic unit, when the difference between the reference voltage applied to said reference power input portion and the voltage applied to said power supply output portion is equal to or greater than a predetermined value, a resistance value between a source electrode and a drain electrode of said transistor is set so that the difference between the voltage applied to said power supply output portion and the reference voltage applied to said reference power input portion is less than a predetermined value, and
   wherein in said arithmetic unit, when the difference between the reference voltage applied to said reference power input portion and the voltage applied to said power supply output portion is less than a predetermined value, the resistance value between the source electrode and the drain electrode of said transistor is set so that the difference between the voltage applied to said power supply output portion and the reference voltage applied to said reference power input portion is maintained.

3. The semiconductor device as set forth in claim 1,
   wherein a switch section is disposed between said power supply line and said circuit section, and
   wherein a connection state in which said power supply line and said circuit section are connected to each other and a shutdown state in which the connection of said power supply line and said circuit section is shut down are switched in response to a signal supplied to said switch section.

4. The semiconductor device as set forth in claim 3, wherein said switch section is connected to a pad provided within said semiconductor chip forming region, and
wherein said signal is input to said switch section through said pad by bringing a signal input terminal into contact with said pad.

5. The semiconductor device as set forth in claim 3, wherein a receiving circuit that performs communication with the outside is disposed within said semiconductor chip forming region by capacitive coupling or inductive coupling,
wherein said switch section is connected to said receiving circuit, and
wherein said signal is input to said switch section through said receiving circuit.

6. The semiconductor device as set forth in claim 3, wherein said switch section is disposed between said power supply line and said circuit section, and includes a second transistor connected thereto, and
wherein a connection state in which said power supply line and said circuit section are connected to each other and a shutdown state in which the connection of said power supply line and said circuit section is shut down are switched by driving or stopping said second transistor in response to a signal input to said switch section.

7. The semiconductor device as set forth in claim 1, wherein a current detecting element used in detecting a value of the current flowing in said circuit section is disposed within at least one semiconductor chip forming region of each of said semiconductor chip forming regions.

8. The semiconductor device as set forth in claim 7, wherein said control circuit section includes a power supply output portion for outputting electric power from said power supply line to said circuit section, and
wherein said current detecting element includes
a resistor element of which one end is connected to said power supply output portion of said control circuit section, and of which the other end is connected to said circuit section, and
a detection section that detects the potential difference generated between the ends of said resistor element.

9. The semiconductor device as set forth in claim 1, wherein a current detecting element used in detecting a value of the current flowing in said circuit section is disposed within at least one semiconductor chip forming region of each of said semiconductor chip forming regions,
wherein a reference power input portion to which electric power from said reference power line is input,
a power supply input portion to which electric power from said power supply line is input, and
a power supply output portion for outputting electric power from said power supply line to said circuit section are formed in said control circuit section,
wherein said control circuit section includes
an arithmetic unit that calculates the difference between a reference voltage applied to said reference power input portion and a voltage applied to said power supply output portion, and
a third transistor which is connected to said arithmetic unit, disposed between said power supply output portion and said power supply input portion, and connected to said power supply output portion and said power supply input portion,
wherein in said arithmetic unit, when the difference between the reference voltage applied to said reference power input portion and the voltage applied to said power supply output portion is equal to or greater than a predetermined value, a gate voltage of said third transistor is set so that the difference between the voltage applied to said power supply output portion and the reference voltage applied to said reference power input portion is less than a predetermined value,
wherein in said arithmetic unit, when the difference between the reference voltage applied to said reference power input portion and the voltage applied to said power supply output portion is less than a predetermined value, the gate voltage of said third transistor is set so that the difference between the voltage applied to said power supply output portion and the reference voltage applied to said reference power input portion is maintained,
wherein said current detecting element includes
a fourth transistor,
a resistor element connected to said fourth transistor in series, and
a detection section that detects a voltage applied to said resistor element, and
wherein the same voltage as the voltage applied to the gate electrode of said third transistor of said control circuit section is applied to the gate electrode of said fourth transistor.

10. The semiconductor device as set forth in claim 7, wherein said current detecting element includes
a current source that causes a current of a predetermined amount to flow in said circuit section,
a second switch section for connecting a power input portion of said circuit section to said current source or said control circuit section, and
a comparator that detects a voltage applied to said power input portion of said circuit section and compares the detected voltage with said reference voltage, in a state where said power input portion of said circuit section is connected to said current source by said second switch section.

11. The semiconductor device as set forth in claim 1, wherein said power supply line and said reference power line are disposed outside said semiconductor chip forming region,
wherein a seal ring, surrounding said control circuit section, which is connected to said control circuit section, and
a conductive layer which is insulated from said seal ring and connected to said control circuit section are disposed within said semiconductor chip forming region,
wherein one of said power supply line and said reference power line is connected to said control circuit section through said seal ring, and
wherein the other of said power supply line and said reference power line is connected to said control circuit section through said conductive layer.

12. The semiconductor device as set forth in claim 11, wherein an insulating film is provided over said semiconductor wafer,
wherein said seal ring is disposed over said insulating film, and wherein said conductive layer is a polysilicon film that passes below said seal ring and passes inside said insulating film.

13. The semiconductor device as set forth in claim 11, wherein an insulating film is provided over said semiconductor wafer,
wherein said seal ring is disposed over said insulating film, and
wherein said conductive layer is an impurity diffusion layer, passing below said seal ring, which is formed in a surface layer of said semiconductor wafer below said insulating film.

14. A method of testing the semiconductor device as set forth in claim 1, further comprising:
supplying electric power from said power supply line and said reference power line to said control circuit section, and controlling a voltage of electric power supplied from said power supply line, in said control circuit section, on the basis of a reference voltage from said reference power line, to adjust a voltage of electric power supplied to said circuit section and perform a test of said circuit section.

15. The method of testing the semiconductor device as set forth in claim 14,
wherein in the semiconductor device, a switch section is disposed between said power supply line and said circuit section, and a connection state in which said power supply line and said circuit section are connected to each other and a shutdown state in which the connection of said power supply line and said circuit section is shut down can be switched in response to a signal supplied to said switch section,
wherein the test method further comprises
setting said power supply line and said circuit section to a connection state by said switch section, and supplying electric power to said circuit section, to determine whether the current flowing in said circuit section is equal to or less than a predetermined value,
determining that said circuit section is normal when said current value is equal to or less than a predetermined value, connecting said power supply line and said circuit section by said switch section, supplying electric power from said power supply line and said reference power line to said control circuit section, controlling a voltage of electric power supplied from said power supply line, in said control circuit section, in response to a reference voltage from said reference power line, and adjusting a voltage of electric power supplied to said circuit section, to perform a test of said circuit section, and
determining that said circuit section is defective when said current value exceeds a predetermined value, shutting down said circuit section and said power supply line from each other by said switch section, in order not to perform a test of said circuit section.

16. The method of testing the semiconductor device as set forth in claim 15,
wherein a current detecting element used in detecting a value of the current flowing in said circuit section is disposed within at least one semiconductor chip forming region of each of said semiconductor chip forming regions,
wherein said control circuit section includes a power supply output portion for outputting electric power from said power supply line to said circuit section,
wherein said current detecting element includes
a resistor element of which one end is connected to said power supply output portion of said control circuit section, and of which the other end is connected to said circuit section, and
a detection section that detects the potential difference generated between the ends of said resistor element, and
wherein said supplying electric power to said circuit section to determine whether the current flowing in said circuit section is equal to or less than a predetermined value includes
supplying electric power to said circuit section through said control circuit section,
detecting the potential difference generated between the ends of said resistor element in said detection section, and calculating a value of the current flowing in said circuit section from the detected potential difference and a resistance value of said resistor element, and
determining whether the calculated value of the current flowing in said circuit section is equal to or less than a predetermined value.

17. The method of testing the semiconductor device as set forth in claim 15,
wherein a current detecting element used in detecting a value of the current flowing in said circuit section is disposed within at least one semiconductor chip forming region of each of said semiconductor chip forming regions,
wherein a reference power input portion to which electric power from said reference power line is input,
a power supply input portion to which electric power from said power supply line is input, and
a power supply output portion for outputting electric power from said power supply line to said circuit section are formed in said control circuit section,
wherein said control circuit section includes
an arithmetic unit that calculates the difference between a reference voltage applied to said reference power input portion and a voltage applied to said power supply output portion, and
a third transistor which is connected to said arithmetic unit, disposed between said power supply output portion and said power supply input portion, and connected to said power supply output portion and said power supply input portion,
wherein in said arithmetic unit, when the difference between the reference voltage applied to said reference power input portion and the voltage applied to said power supply output portion is equal to or greater than a predetermined value, a gate voltage of said third transistor is set so that the difference between the voltage applied to said power supply output portion and the reference voltage applied to said reference power input portion is less than a predetermined value,
wherein in said arithmetic unit, when the difference between the reference voltage applied to said reference power input portion and the voltage applied to said power supply output portion is less than a predetermined value, the gate voltage of said third transistor is set so that the difference between the voltage applied to said power supply output portion and the reference voltage applied to said reference power input portion is maintained,
wherein said current detecting element includes
a fourth transistor,
a resistor element connected to said fourth transistor in series, and a detection section that detects a voltage applied to said resistor element, wherein the same voltage as the voltage applied to the gate electrode of said third transistor of said control circuit section is applied to the gate electrode of said fourth transistor, and wherein said supplying electric power to said circuit section to determine whether the current flowing in said circuit section is equal to or less than a predetermined value includes driving said third transistor to cause a current to flow in said circuit section, applying a predetermined voltage which is the same voltage as the voltage applied to the gate electrode of said third transistor of said control circuit section to the gate electrode of said fourth transistor of said current detecting element, detecting a voltage of said resistor element in said detection section by causing a current to flow from a fourth transistor to said resistor element, grasping a ratio of the current flowing in said third transistor at said predetermined voltage to the current flowing in said fourth transistor, detecting the current flowing in said resistor element on the basis of resistance of said resistor element and the voltage detected in said detection section, calculating the current flowing in said circuit section from the detected current flowing in said resistor element and the ratio of the current flowing in said third transistor to the current flowing in said fourth transistor, and determining whether the calculated value of the current flowing in said circuit section is equal to or less than a predetermined value.

18. The method of testing the semiconductor device as set forth in claim 15, wherein a current detecting element used in detecting a value of the current flowing in said circuit section is disposed within at least one semiconductor chip forming region of each of said semiconductor chip forming regions, wherein said current detecting element includes a current source that causes a current of a predetermined amount to flow in said circuit section, a second switch section for connecting a power input portion of said circuit section to said current source or said control circuit section, and a comparator that detects a voltage applied to said power input portion of said circuit section and compares the detected voltage with said reference voltage, in a state where said power input portion of said circuit section is connected to said current source by said second switch section, and wherein said supplying electric power to said circuit section to determine whether the current flowing in said circuit section is equal to or less than a predetermined value includes supplying a current of a different amount of current from said current source to said circuit section multiple times, associating the amount of the current flowing from said current source to said circuit section with a comparison result obtained by comparing in said comparator whether any of a voltage applied to said power input portion of said circuit section and said reference voltage is larger, and grasping the association thereof, detecting a point in time at which the voltage applied to said power input portion of said circuit section and the reference voltage become equal to each other from said comparison result, detecting a point in time at which the voltage applied to said power input portion of said circuit section and the reference voltage become equal to each other on the basis of the amount of the current flowing from said current source to said circuit section and the comparison result in said comparator, and grasping the amount of the current flowing from said current source to said circuit section at said point in time, and determining whether the grasped value of the current flowing in said circuit section is equal to or less than a predetermined value.

* * * * *